United States Patent [19]

Baxter et al.

[11] Patent Number: 5,337,151
[45] Date of Patent: Aug. 9, 1994

[54] DOUBLE-SIDED CIRCUIT BOARD EXPOSURE MACHINE AND METHOD WITH OPTICAL REGISTRATION AND MATERIAL VARIATION COMPENSATION

[75] Inventors: Gregory R. Baxter, Orange; Jeffrey Tesone, Rialto; Glenn Rivard, Pasadena, all of Calif.

[73] Assignee: Optical Radiation Corporation, Azusa, Calif.

[21] Appl. No.: 921,501

[22] Filed: Jul. 28, 1992

[51] Int. Cl.$^5$ .................. G01B 11/00; G01N 21/84
[52] U.S. Cl. .................. 356/401; 250/548; 355/53
[58] Field of Search .............. 355/53, 26, 89; 356/399, 400, 401; 250/548, 557

[56] References Cited

U.S. PATENT DOCUMENTS

| | | | |
|---|---|---|---|
| 3,937,579 | 2/1976 | Schmidt | 356/144 |
| 4,525,061 | 6/1985 | Oki | 355/72 |
| 4,643,579 | 2/1987 | Toriumi et al. | 356/401 |
| 4,764,791 | 8/1988 | Omata et al. | 355/32 |
| 4,772,123 | 9/1988 | Radner | 356/400 X |
| 4,792,693 | 12/1988 | Yamaguchi et al. | 356/401 X |
| 4,842,412 | 6/1989 | Miyake | 356/401 |
| 4,952,060 | 8/1990 | Ina et al. | 356/400 X |
| 5,003,342 | 3/1991 | Nishi | 355/53 X |
| 5,042,709 | 8/1991 | Cina et al. | 228/105 |
| 5,182,615 | 1/1993 | Kurosawa et al. | 356/400 |

FOREIGN PATENT DOCUMENTS

464450A1 1/1992 European Pat. Off. ............ 356/399

Primary Examiner—Robert J. Warden
Assistant Examiner—E. Leigh Dawson
Attorney, Agent, or Firm—Christie, Parker & Hale

[57] ABSTRACT

A double-sided exposure apparatus with an optical registration system accurately aligns and prints a circuit pattern on both sides of a workpiece, such as a circuit board. The apparatus has a computer system in which setup parameters are entered to set the desired size of the board and accuracy of alignment. A control program of the computer directs a machine vision system to inspect the workpiece and pattern, and computes precision movements of the workpiece which compensate for any sag or other variations in the glass or board that change between off-contact and soft contact. The computer system uses fiducials on the two artworks and target holes on each board to align an artwork and the board prior to exposure. At least one inspection of the fiducials, and realignment of the workpiece, is performed after the pattern is in contact with the workpiece, to thereby compensate for workpiece warpage, variations, and sag or variations of the artwork holders. Alignment uses video cameras to detect the centers of the fiducials and target using a "best-fit" data processing method, which method includes compensation for any sag in the glass artwork holders.

26 Claims, 14 Drawing Sheets

Microfiche Appendix Included
(406 Microfiche, 7 Pages)

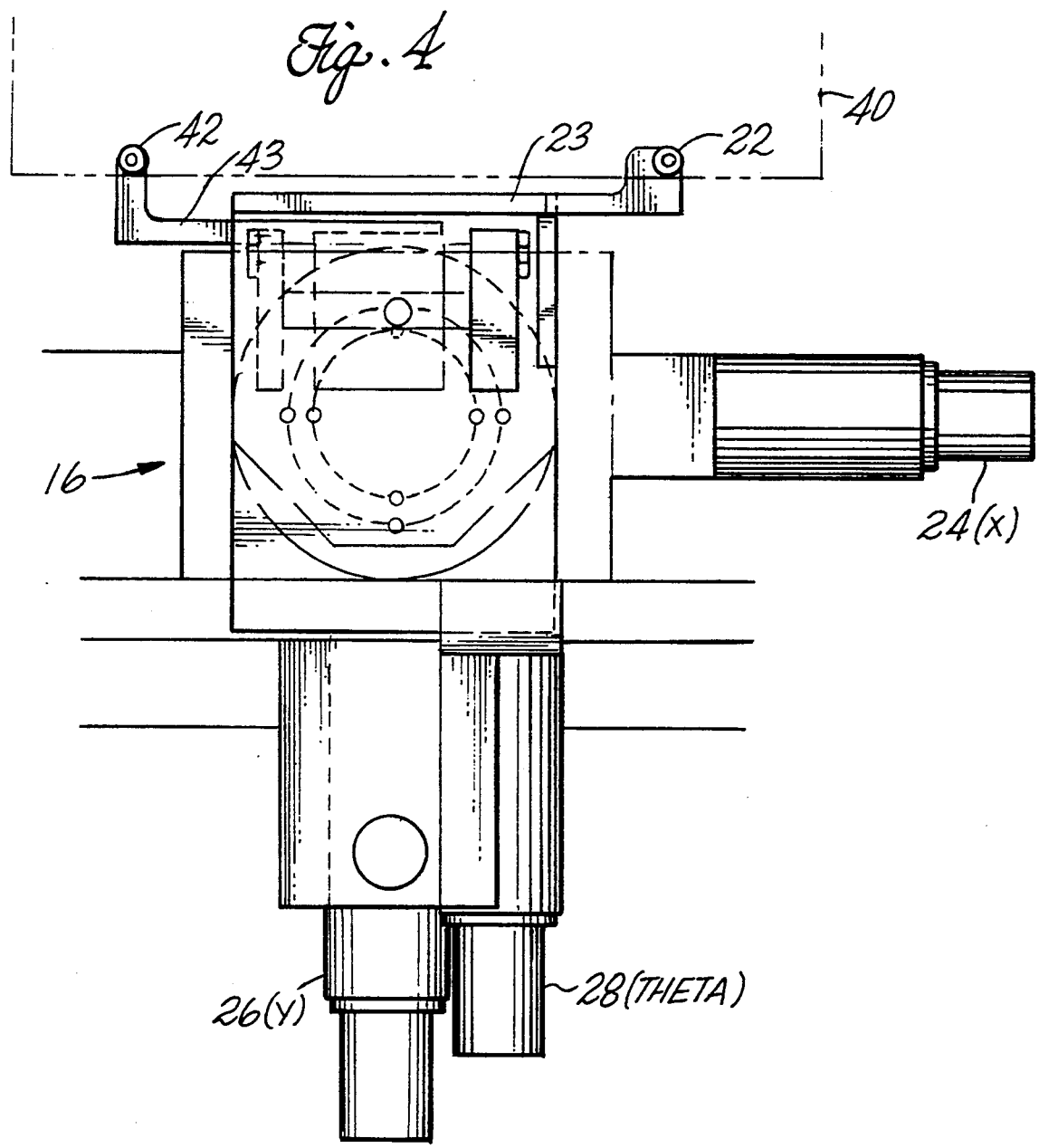

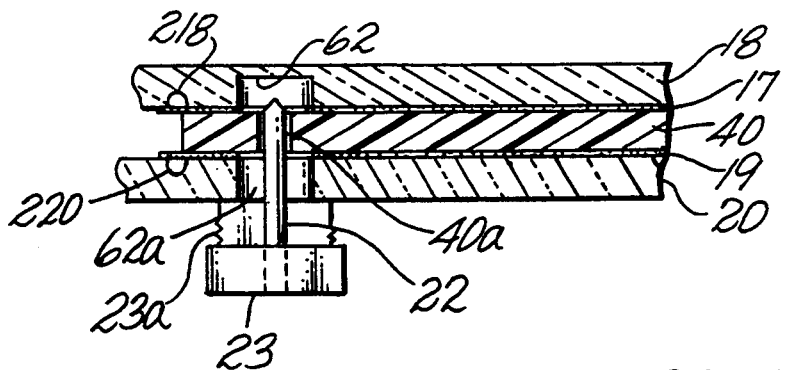
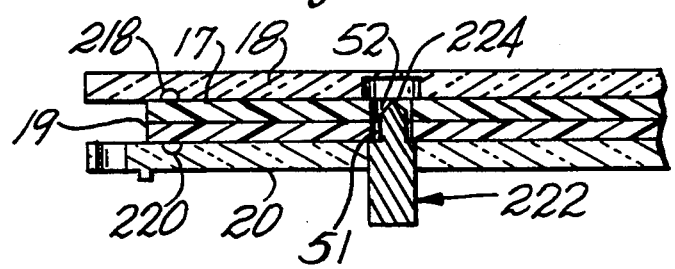
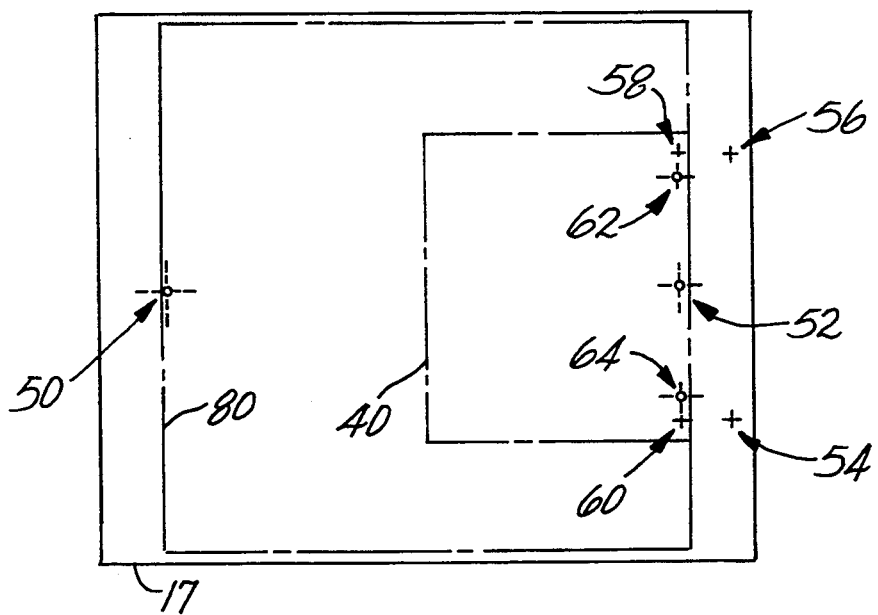

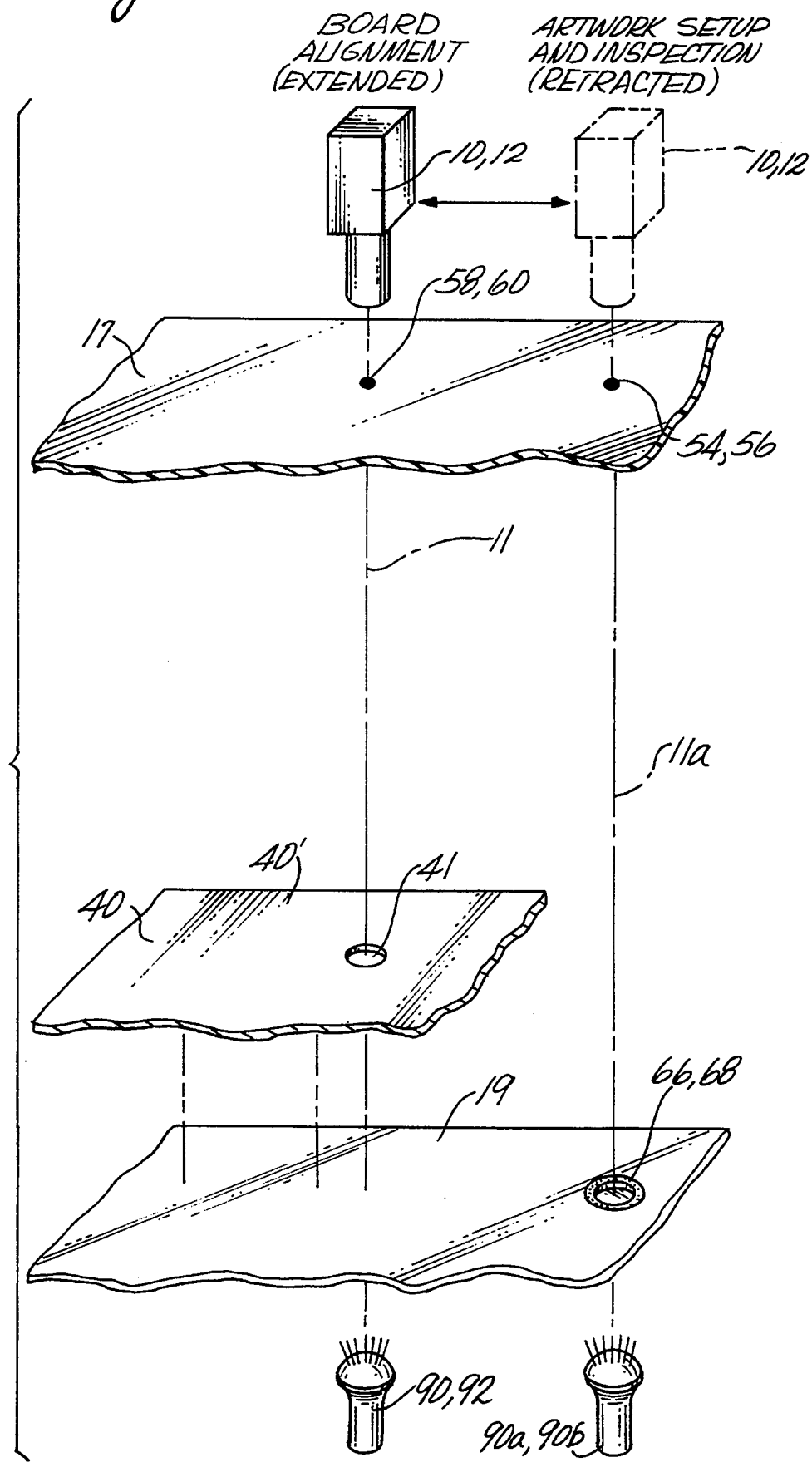

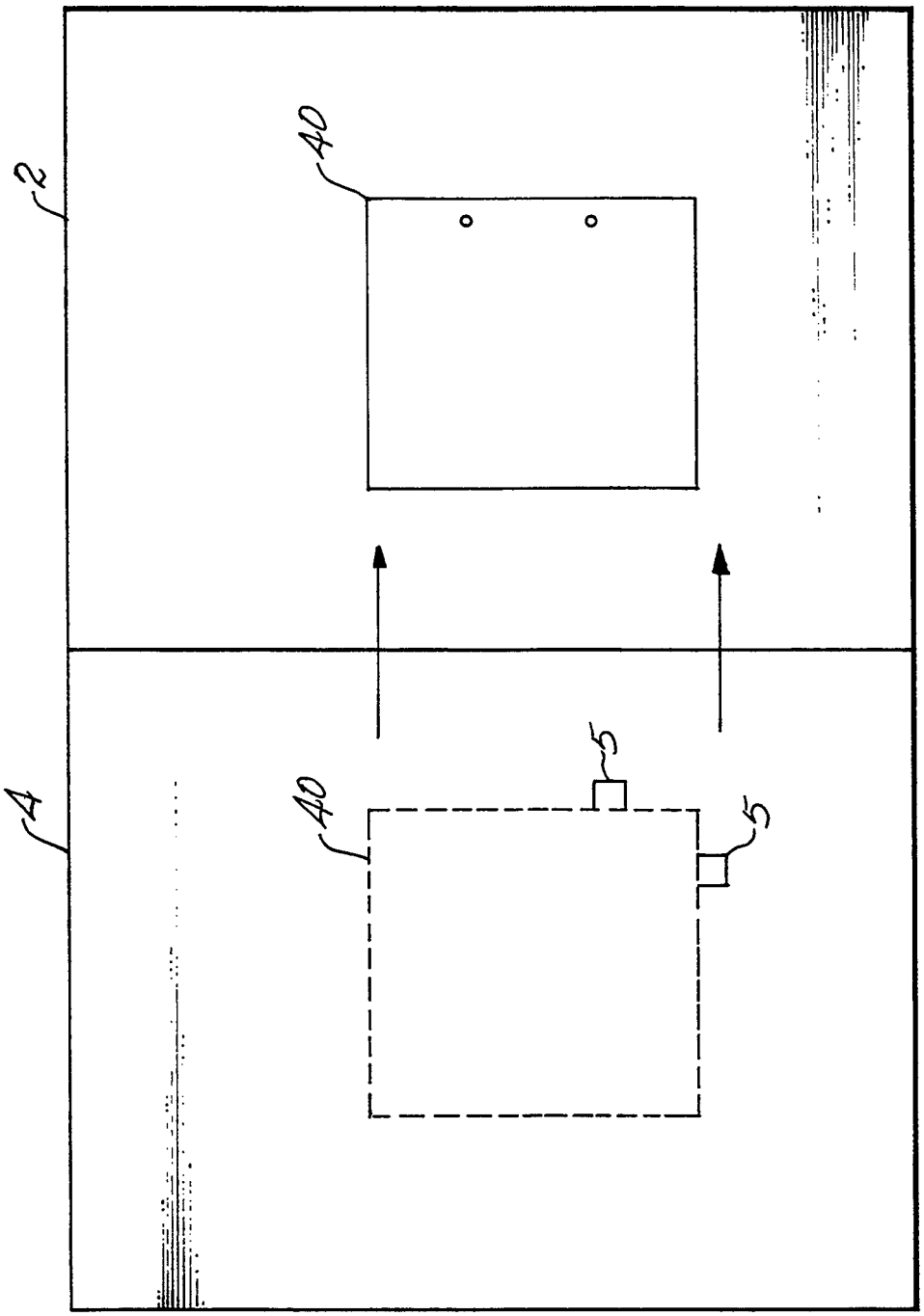

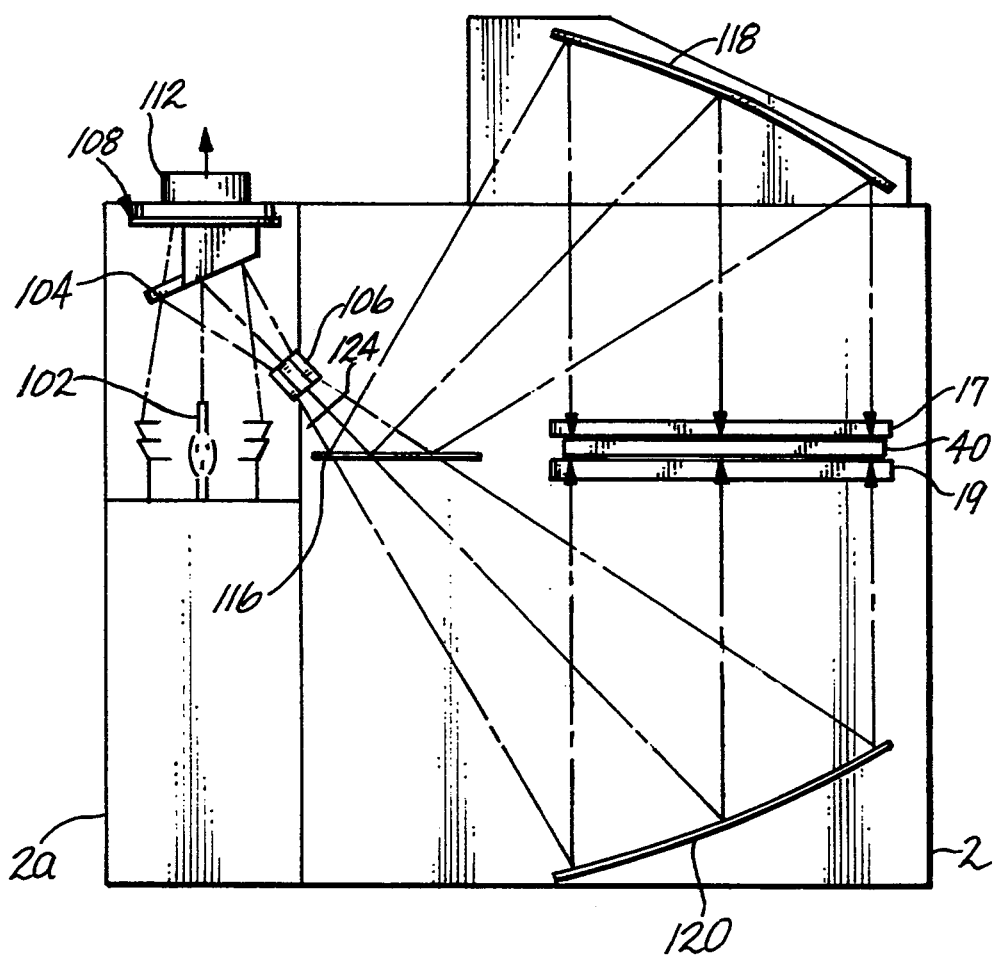

DOUBLE-SIDED CIRCUIT BOARD EXPOSURE MACHINE AND METHOD WITH OPTICAL REGISTRATION AND MATERIAL VARIATION COMPENSATION

REFERENCE TO MICROFICHE APPENDIX

This document includes a microfiche appendix of 7 microfiche with 392 frames.

BACKGROUND OF THE INVENTION

1. Field of the Invention

The present invention generally relates to an optical registration system for an exposure apparatus, and more particularly, to an optical registration system for aligning printed circuit boards with two artworks, while compensating for any variations in glass, artworks, or boards to be exposed, in a double-sided exposure apparatus, and a data processing method therefor.

2. Description of the Background Art

During production of printed circuit boards, a wiring pattern is printed on a blank copper-clad circuit board or panel. The blank panel is moved into an exposure machine. The pattern is carried on a master known as an artwork, which is formed by resin or by a glass substrate with a thin film coating, such as mylar film. The circuit pattern appears in opaque lines on the otherwise transparent film or substrate. The fragile, heat-sensitive artwork or phototool is typically supported on a glass plate or artwork holder. The exposure machine applies ultraviolet (UV) light through the artwork to imprint the circuit pattern on a light-sensitive coating on the board. The copper underlying the coating is then chemically stripped off.

Generally, such exposure machines with optical registration only can print on one side of the board at a time. However, it is desirable to print on both sides of the board at the same time to speed up production and increase accuracy. One such exposure machine that prints on both sides of the board is disclosed in U.S. Pat. No. 4,764,791 (Omata et al.).

Double-sided boards usually have component mounting holes extending through the board. Before double-sided exposure, each upper and lower artwork and the board must be aligned correctly with respect to each other. In Omata et al., alignment is performed before the board enters the exposure chamber of the exposure machine. This alignment can then be checked by a camera. If the alignment is improper, the board is rejected and realigned or otherwise removed from the machine. Since alignment takes place outside the exposure chamber, misalignment is likely due to positional shifts caused by moving the board from the alignment station to the exposure position. Moreover, when the artworks are brought into contact, inaccuracies can occur from variations in the horizontal planar surfaces of each material, e.g., warpage and shape variations of the boards and the glass plates which are part of each artwork holding structure and/or expansion of the glass or artworks due to heat during the course of a production run.

Alignment inside the exposure chamber is described in Miyake U.S. Pat. No. 4,842,412. However, the alignment is only for a single side of the circuit board at a time.

A very high degree of precision in processing of printed circuit boards is now in demand. Surface-mount integrated circuit technology requires a finer pitch package, e.g., as little as 4 mils or less between leads. Thus, there is a need for a double-sided exposure machine that accurately aligns both artworks with each side of the circuit board and can compensate for sag of glass supporting an artwork and board variations.

There is a need for an accurate, fast double-sided exposure system which can use a machine vision system to achieve high accuracy.

There is also a need for a double-sided exposure system capable of using modern software technology to provide a user interface which is simple and easy to use.

Another need in the art is for a programmable system in which principal processing steps are written in a high-level computer programming language, enabling user modification without assembly language programming required by prior art systems.

SUMMARY OF THE INVENTION

The present invention provides an exposure apparatus with a registration system for alignment of artworks, and alignment of each board to the artworks, which registration is carried out inside an exposure chamber to achieve double-sided alignment and exposure with a high degree of precision.

The present invention provides a double-sided exposure apparatus with an optical registration system for accurately printing a circuit pattern on a photosensitive layer on both sides of a workpiece, e.g., a printed circuit board or panel. The apparatus includes a pre-alignment station, an exposure chamber, an outfeed station, an infeed carriage for conveying a board from the pre-alignment station to the exposure chamber, a system for aligning the board with each upper and lower artwork inside the exposure chamber, a UV light source for exposing simultaneously each side of the board, thus causing each side to receive an image corresponding to each artwork located in the exposure chamber, and an outfeed carriage for conveying the exposed board from the exposure chamber to the outfeed station.

The upper glass that holds the upper artwork is mounted in a four-post die set that moves up and down by pneumatic cylinders. The lower artwork holder is fixed in position. Two motorized screw mechanisms with encoders coupled to the control unit enable the upper phototool to be spaced off the lower phototool according to the thickness of boards to be exposed, under computer control. A precision motorized X Y Theta stage is mounted outside the image area at one end of the die set.

The present invention also provides a computer system in which setup parameters are entered to set the desired size of the board and accuracy of alignment and to compensate for any variations. Based on the setup parameters, stop bars on the pre-alignment station are indexed to appropriate positions to stop incoming boards under the carriage, and proper suction cups on the carriage for carrying the board are enabled. After a production run on one size board, any changeover to a different board size is quick.

In addition, the system for aligning the board does so based on the setup parameters. The computer system uses fiducials on the two artworks and a target hole, or fiducial, on each board to optically align the artworks with each other during setup and to align the board with the artworks prior to exposure. Alignment is conducted by using video cameras and a machine vision system to detect the positions of the fiducials and target and to perform a "best-fit" analysis of the position of the artworks and board, as disclosed herein. This analysis includes compensation for any variations in the glass of the artwork holders, the artworks, and the specific board to be exposed.

BRIEF DESCRIPTION OF THE DRAWINGS

FIG. 4 is an enlarged top view of an X, Y, Theta alignment stage in the exposure chamber;

FIG. 5 is an enlarged partial sectional view of one align taper pin engaged with a board and two artwork holders in the exposure chamber;

FIG. 6a is a top schematic view of a board in alignment relationship with two artworks;

FIG. 6b is an exploded schematic view of the alignment relationship of camera, board, and artwork;

FIG. 6c is an enlarged sectional view of part of the artworks and glass of the artwork holders, showing a registration pin in operation during setup;

FIG. 7 is a top schematic view of the pre-alignment station and the exposure chamber;

FIG. 8 is a schematic diagram of the light exposure system for the exposure chamber of FIG. 2;

DETAILED DESCRIPTION OF THE PREFERRED EMBODIMENTS

A. Overview and Artwork Alignment

Figure 1:
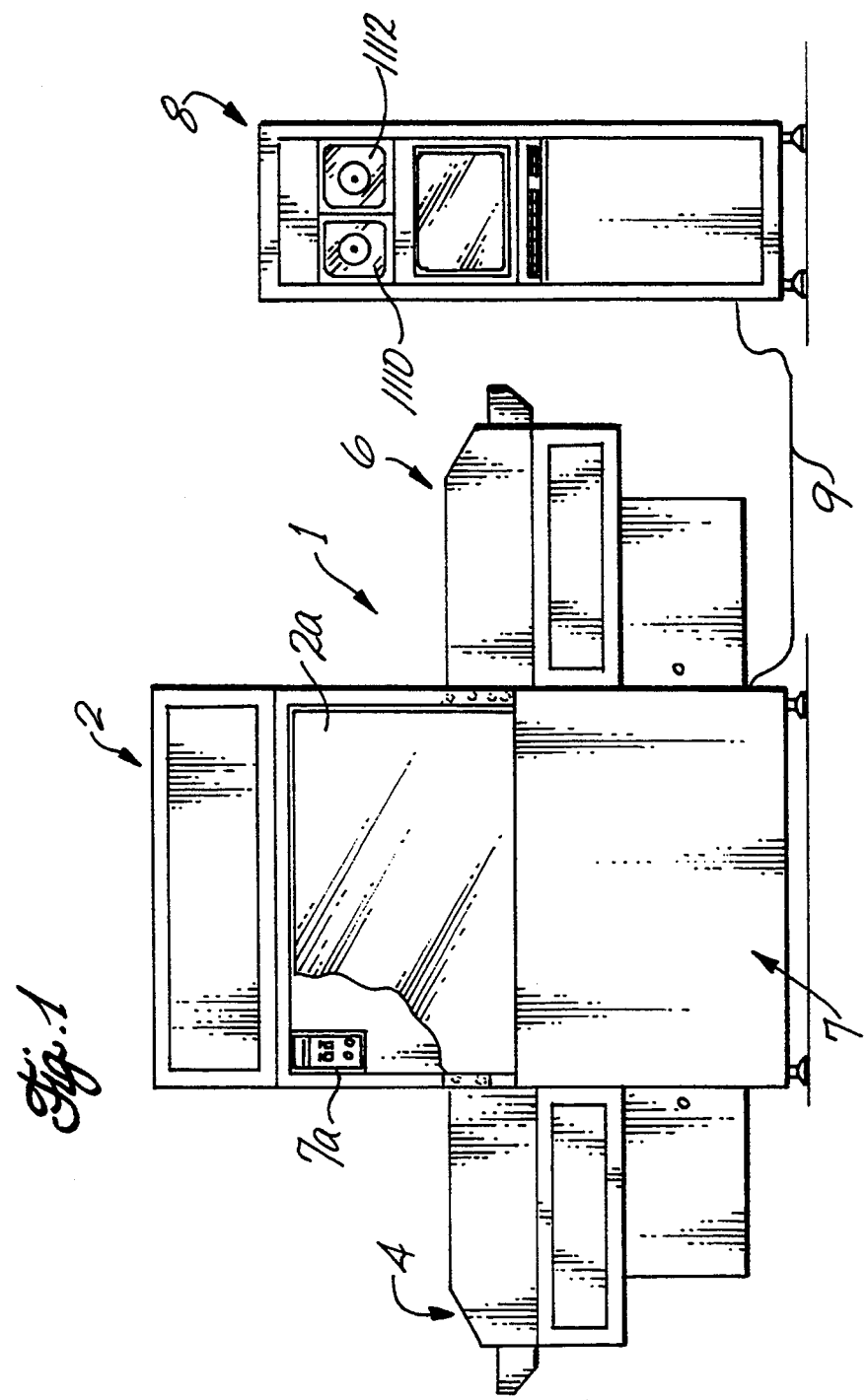
FIG. 1 is a front elevation view of one embodiment of an optical registration exposure apparatus constructed in accordance with the present invention.

FIG. 1 is a front elevational view of an embodiment of a double-sided optical registration exposure apparatus 1 in accordance with the present invention. The apparatus includes a centrally-disposed exposure chamber 2, a pre-alignment station 4, a collection station 6, and a computer control cabinet 8 communicating with the rest of the exposure apparatus via a cable 9. A lower equipment cabinet mounted below and supporting the exposure chamber contains additional electronics for controlling the position of a board in the exposure chamber. A control panel 7a is provided in the exposure chamber for manual control of the electronics in cabinet 7. Preferably, the exposure chamber 2 has a front window 2a of non-UV-transmitting material (preferably of plastic) to enable an operator to view the interior of the exposure chamber without suffering damage from ultraviolet light therein. A work, such as a printed circuit board, is placed initially on the pre-alignment station 4. After receiving setup parameters, the computer in cabinet 8 sends commands through cable 9 to control mechanisms (described later) in the machine and in cabinet 7 to convey the work from the pre-alignment station 4 to the exposure chamber 2. Alignment takes place inside the exposure chamber, the board is exposed and then later transferred to the outfeed station 6.

Initially, before a board is inserted into the exposure chamber, each artwork master or phototool is disposed in an artwork holder, and these holders are aligned with respect to each other. More specifically, with reference to FIGS. 2, 6a, and 6c, in the exposure chamber, there is an upper artwork holder 18 formed by a frame 18a and a glass plate 18b which is normally spaced from a lower artwork holder 20 which is also formed by a frame 20a and a glass plate 20b. The artwork holders will each hold an artwork, upper artwork 17 and lower artwork 19, respectively, such that the artworks face one another.

In the preferred embodiment specifically shown in the figures, and with particular reference to FIG. 6c, setup of the artworks is achieved with the following structure: the lower holder 20 has two extendible/retractable registration pin mechanisms 222 (FIGS. 2, 3, and 6c) which are bonded in the glass plate of the lower artwork holder 20. Registration pins 224 are extendible and retractable from the mechanisms 222 under pneumatic control in a manner well known in the art. One pin 224 is shown passing through holes 51, 52 in the artworks and into a hole or recess in the upper glass plate of the upper artwork holder 18. The other mechanism looks exactly the same. The holes 51, 52 are accurately preformed registration pin holes formed in each artwork. As shown in FIG. 6a, there are two such holes 50, 52 in the upper artwork and two holes (only 51 is shown in FIG. 6c) in the lower artwork, which holes each correspond to the two registration pins in the lower glass plate. With the registration pins 224 in the upwardly extended position, the artworks 17, 19 are manually fit over the pins with the upper artwork on top of the lower one. The upper artwork holder 18 is then automatically lowered, e.g., using a pneumatic cylinder mechanism 202 connected to frame 18b, as shown in FIG. 2, until it contacts the artworks.

Preferably before retracting the pins, a vacuum supply is applied to perimeter grooves 218, 220 formed near and around the edges of the glass of both the upper and lower artwork holders 18, 20 to tightly hold the upper and lower artworks in place against the upper and lower glass plates, respectively. These grooves and the vacuum source are well known in the art, e.g., in machine model numbers 6036, 6050, 7150, and 7550, commercially available from Optical Radiation Corporation of Azusa, Calif. Preferably, a vacuum of about 15" to 17" Hg is applied. The pins 222 are then retracted. The upper artwork holder 18 is then moved to an off-contact position close to the lower holder 20 so that two cameras 10, 12 may be used to confirm alignment of the artworks, as explained below. Movement to the off-contact position may be accomplished by an off-contact mechanism 203 with an extendible retractable computer motor-controlled member 203a that is positioned to pass by the lower artwork holder 20 (and the board, when present), yet contact and lift the upper holder 18 against the pressure of mechanism 202 (see FIG. 2).

Figure 2:
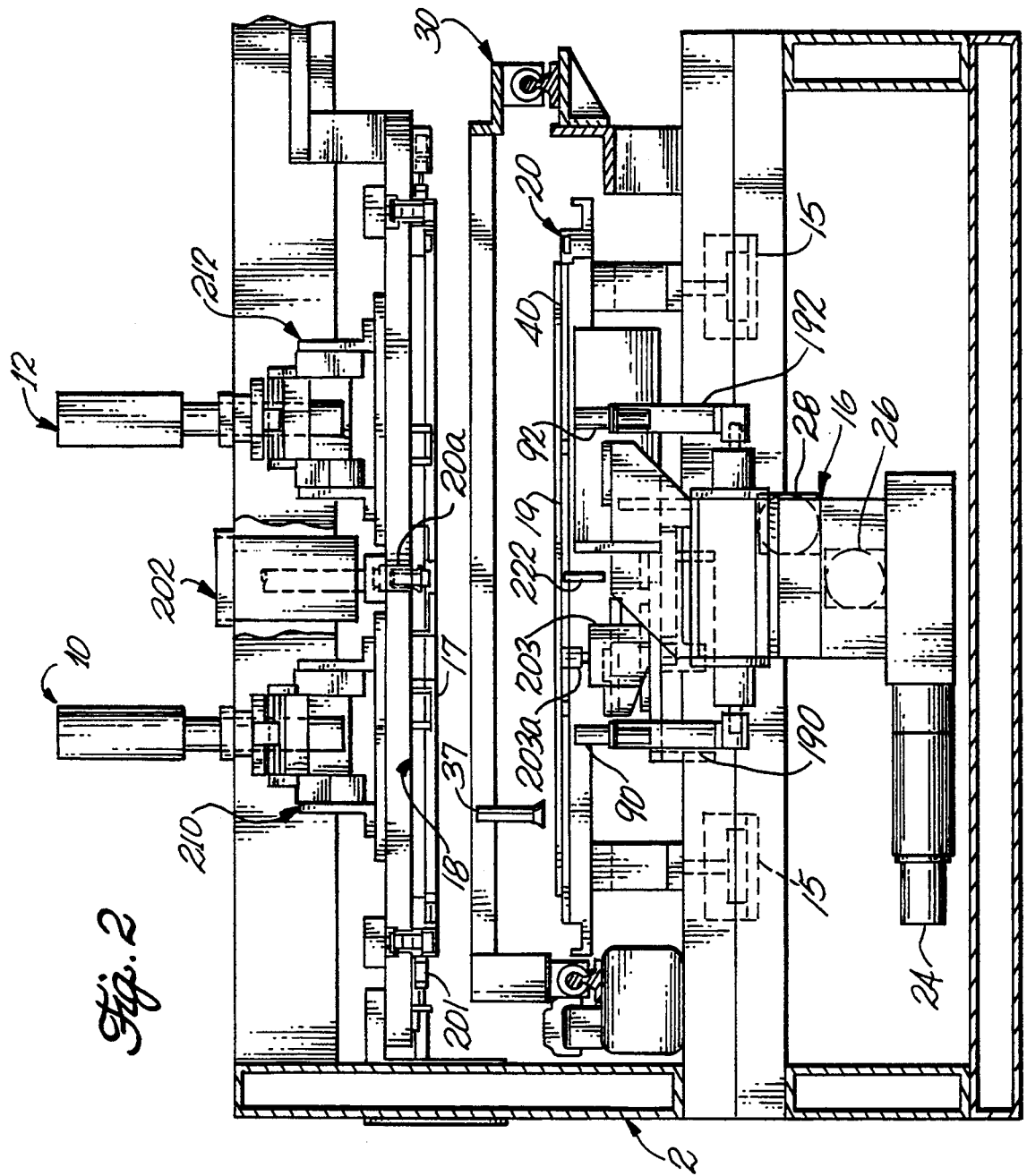
FIG. 2 is a right side view schematically illustrating essential components constituting an exposure chamber of the apparatus of FIG. 1.

The two cameras 10, 12 are shown in FIG. 2 positioned at one end of the exposure chamber and mounted on precision slides 210, 212 so that they are horizontally movable between extended and retracted positions (see FIG. 6b).

In the retracted position, the cameras are clear of the board for conducting exposure and also are in alignment with fixed illuminators 90a, 90b (see FIG. 3 also) and fiducials on the two artworks to inspect their alignment. As FIG. 6b shows, the artworks are preferably made to extend rearward beyond the edge 40' of board 40, so that the artwork alignment can be inspected when the cameras are retracted, and so that the board will not interfere with artwork inspection that occurs prior to exposure.

When the cameras are in the extended position, they align with movable illuminators 90, 92 through hole 41. These illuminators 90, 92 are mounted on swing arms 190, 192 so that they can rotate out of the way for exposure.

As also shown in FIGS. 6a, 6b, at locations separate from the registration pin holes, the upper artwork has two fiducials 54, 56, preferably in the form of black dots, e.g., of 0,015" (375 microns) diameter, and the lower artwork has two fiducials, preferably in the form of an opaque circle with a blank center, e.g., of 0,750" (18.75 mm) diameter, with a 0,060" (1.5 mm) blank center diameter. These fiducials are aligned by using the cameras 10, 12 to view the fiducials on a screen and by manually controlling X and Y movement of the upper artwork holder until alignment is within predetermined tolerances. This alignment process could also be automated, e.g., by using a "best-fit" computer analysis and feedback loop.

The top artwork holder 18 is held in place in a horizontal plane by a known latching mechanism. If movement in the horizontal plane is required to completely align the artworks, the upper holder 18 is unlatched and moved in X, Y, and Theta directions by manual micrometers (such as micrometer 201 in FIG. 2) to align the fiducials to the desired tolerance. The user bases manual movement of the micrometers on the display of the fiducial alignment and of the misalignment distances seen at displays 1110, 1112 of computer station 8. The upper artwork then is kept stationary in its aligned reference position, so that board can later be aligned to match the position of the upper artwork, and the lower artwork alignment can be checked by the cameras for any deviation. Since the upper and lower artworks are often punched together, the alignment will often be sufficient just by use of the registration pins. Once alignment is confirmed, the upper artwork moves to the open position, and the system is ready to receive a board, align it, and expose it.

B. Board Alignment Mechanism and Operation

In FIGS. 6a, 6b, and 7, reference numeral 40 denotes the board. At the start of a production run, the board is placed at the infeed or pre-alignment station 4. Motorized rollers (not shown) carry the board from a board loader, or an infeed conveyor, to a pre-align position from which the board is carried into the exposure chamber by a carriage 30. Carriage 30 has a plurality of downward-facing vacuum suction cups 37 attached to its underside. These suction cups are used to lift the board at the pre-align station and drop it in the appropriate position on the lower artwork holder once the carriage has moved into the exposure chamber. Typically, the board is stopped in position for the carriage to pick it up by stop bars 5 located at the end of the rollers.

The computer system, based on setup parameters including the board size, determines the desired locations to place stop bars 5 and determines which vacuum suction cups 37 to activate. After the board 40 is placed on the pre-alignment station 4, the rollers carry the board to the stop bars 5 which then hold the board in a desired location. This procedure provides a rough alignment of the board.

The board is then carried into the exposure chamber by carriage 30. By moving the cups 37 downward and releasing the vacuum on the cups 37, the board is placed on the lower artwork. Each board has two accurately formed pin-receiving holes, and alignment at the pre-alignment station is performed such that when the board is placed on the lower artwork, the holes accurately receive two align taper pins 22 and 42. The carriage 30 then withdraws to its previous position in the pre-alignment station to wait for the next board. The board's position with respect to the exposure chamber 2 is substantially the same as its position with respect to the pre-alignment station 4.

Figure 3:
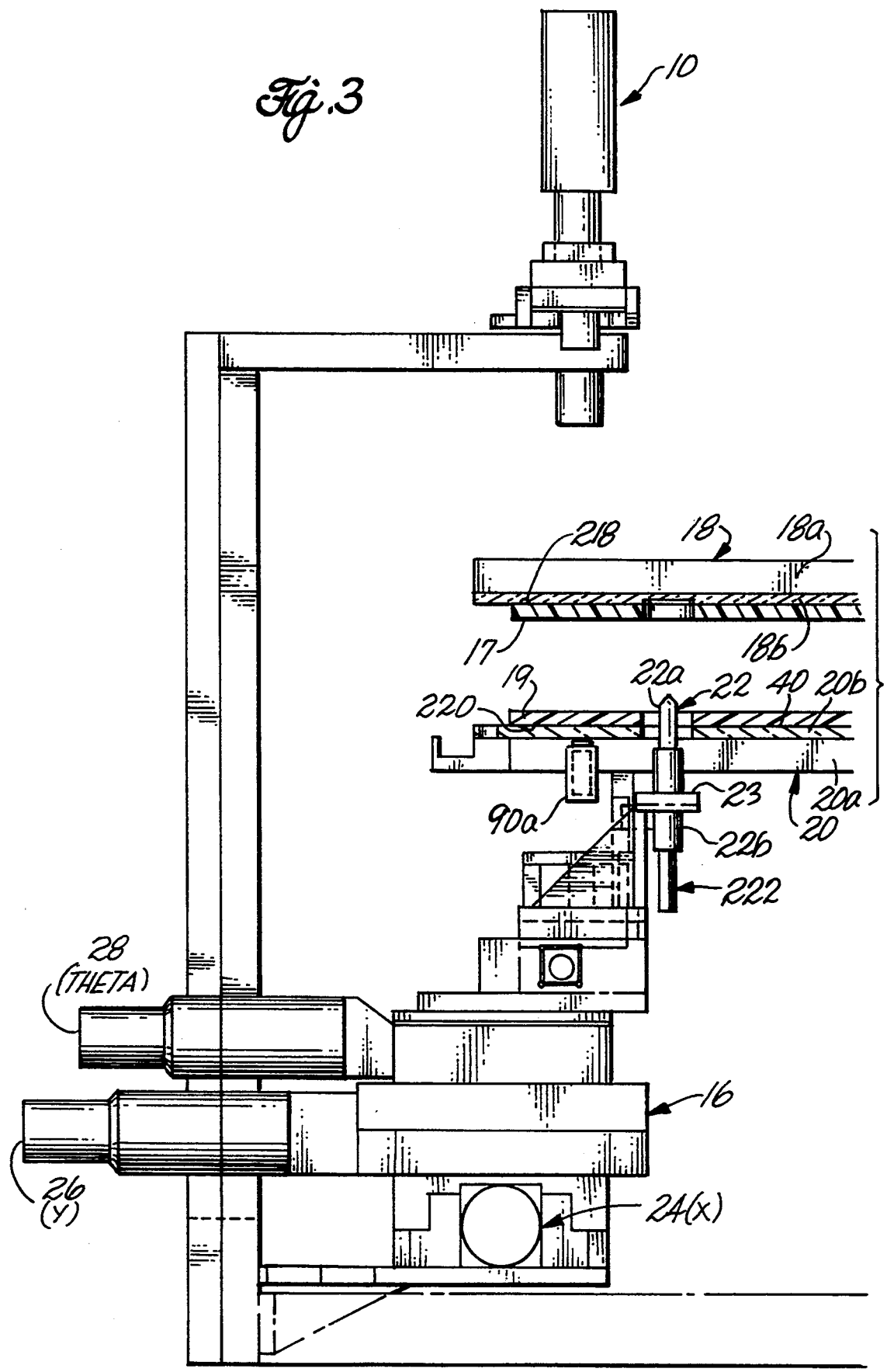
FIG. 3 is a partial rear view schematically illustrating essential components constituting the exposure chamber.

In accordance with one aspect of the invention, the align taper pins 22, 42 provide a rough alignment of the board with respect to the upper artwork so that the target holes on the board and the lower artwork fiducials will be close enough to fiducials in the upper artwork to perform any fine alignment needed. A motorized alignment stage 16, which is inside chamber 2 and is shown in more detail in FIG. 3, is used in conjunction with the align taper pins to perform fine alignment.

Alignment stage 16 has the two align taper pins 22, 42 affixed to it. The alignment stage 16 also has three motorized computer-controlled movable stages or tables called X-table 24, Y-table 26, and Theta-table 28. The X-table and Y-table are movable in an X-direction and Y-direction, respectively, which are at right angles to each other and in a horizontal plane with respect to the board. The Theta-table is movable in a rotational direction in the same plane. The tables are conventional in the art.

Referring now to FIG. 4, a partial top view of the alignment stage 16 with align taper pins 22 and 42 is shown. The two align taper pins are connected to and movable with movement of the stage and tables 24, 26, and 28. Specifically, pin 22 is affixed to the alignment stage 16 by a handle bar 23, and pin 42 is affixed to the alignment stage 16 by a handle bar 43. When the shifting of each individual table occurs, it moves the handle bars 23 and 43 and consequently moves the align taper pins 22, 42. Thus, the align taper pins 22, 42 can be moved in the X-direction, Y-direction and Theta-angle. The location of the pins may be varied, as desired, e.g., at diagonal corners of the board or otherwise.

Alignment of the board 40 with the top artwork 17 is now described with reference to FIGS. 6a and 6b. In the top artwork 17, there are two recesses 62, 64. There are also two corresponding through-panel-alignment pin holes 40a in the bottom artwork. These recesses and pin holes are at locations in which the align taper pins 22, 42 protrude, as shown in FIG. 5 for recess 62 and hole 62a. Preferably, at least one of the pins 22, 42 is laterally movable on a precision slide to exert lateral tension on the board. The pin mechanism 222 has a bellows 23a to provide an airtight seal for vacuum hard contact during exposure.

After the board is carried into the chamber by the carriage 30 and released onto the align taper pins 22, 42, and the pins hold the board by tension, the upper artwork holder is lowered to a close, but off-contact, position (using the off-contact mechanism) for alignment of the board to the artworks. Alignment preferably uses target holes on the board and fiducials on the upper artwork to perform a "best-fit" analysis and uses the X, Y, and Theta tables to correct the board position based on the "best-fit" results. The correction process is described in detail below.

Preferably, four fiducials 54, 56, 58, and 60 are provided on the top artwork 17, each preferably comprising an opaque dot approximately, 0.015" (375 microns) in diameter on a clear background. Two fiducials 54 and 56 of the top artwork 17 are aligned with two corresponding, but different size, fiducials 68 on the bottom artwork. These fiducials are used during the artwork setup process and to inspect the accuracy of upper to lower artwork alignment during the board exposure process, and preferably are positioned outside the board image area where they are viewed by the video cameras in the retracted position. Preferably, the fiducials 68 comprise a 0.06"–0.08" (1.5–2 mm) diameter clear area on an opaque background. The fiducials 58, 60 of the top artwork 17 also are aligned with the two corresponding target holes 41 in the board 40.

If the artworks are not large enough in relation to the board to provide fiducials outside the board area, the lower artwork can be provided with a donut-shaped fiducial on axis 11 that has a clear interior circle surrounded by an opaque ring, so that pre-programmed inspection of the artworks can be accomplished when a board is not present. The diameter of the board's hole should be smaller than the outer diameter of the opaque ring so that misalignment of the board can be detected with respect to the top target.

FIG. 6a also shows a larger-size board 80 (in phantom) in alignment with the top artwork. Each size board to be used with the machine preferably has target holes and the through-panel-alignment pin holes in the same position.

As indicated schematically in FIG. 6b, and in detail in FIGS. 2 and 3, to determine board alignment, each video camera 10, 12 is moved to its extended position, which is vertically above the upper artwork 17 in alignment on axis 11 with each fiducial 58, 60. Each hole 41 of board 40 and each fiducial 58, 60 of upper artwork 17 are already roughly aligned on each axis 11 due to the registration pins and align-taper pins. Each movable illuminator 90, 92 faces upwardly and radiates light along each axis and through each hole 41. Thus, each camera views a "bull's-eye" comprising one of the upper fiducial dots 58, 60 and a corresponding one of the surrounding board target holes 41, when the board and artworks are in proper alignment.

Figure 11:
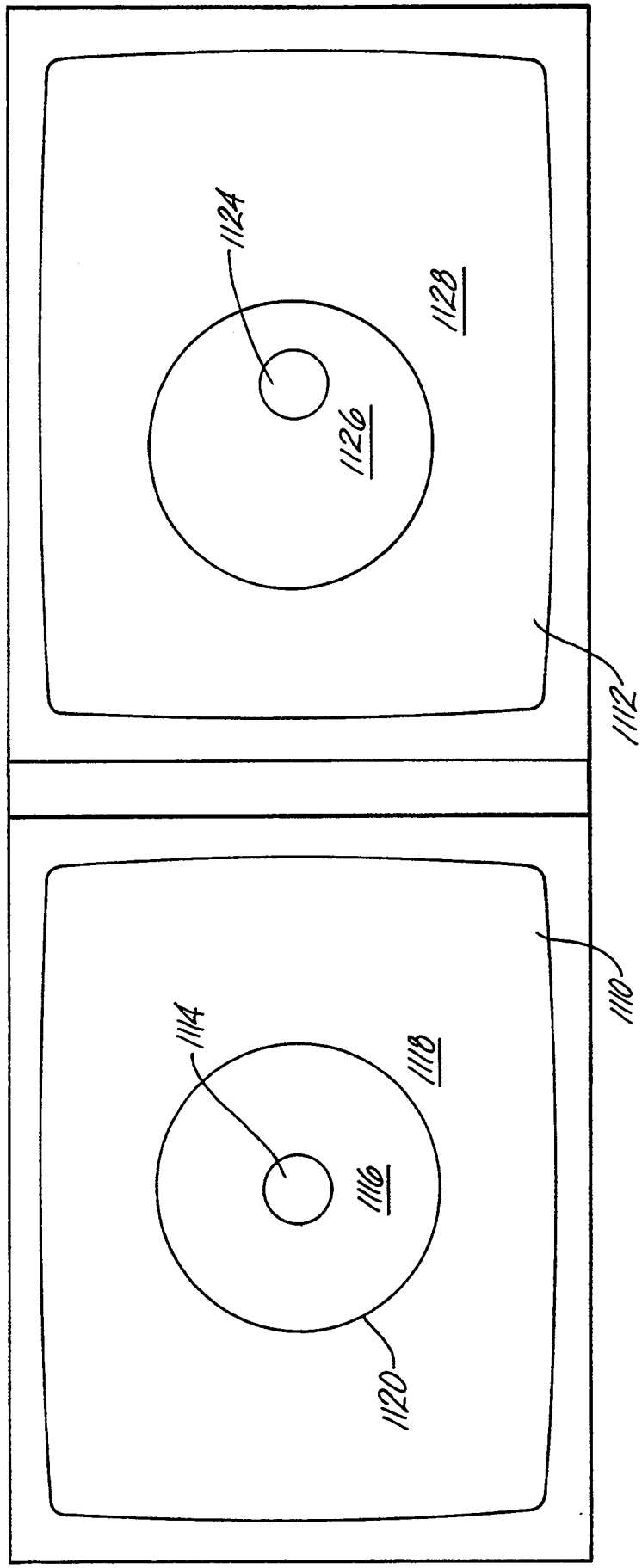
FIG. 11 is a diagram of camera fiducial displays.

A schematic representation of the bull's-eye image viewed by the cameras is shown in FIG. 11. Preferably, the cabinet 8 of the system includes left and right video displays, 1110, 1112. The displays 1110, 1112 can correspond to the video output of cameras 10, 12. Alternatively, one of the displays serves as a program output which is switched between the cameras 10, 12 according to commands from a machine vision system. In this manner, a single display can be rapidly switched between the video signals of either camera to enable rapid comparison of the images and alignment of two separate locations of the board. As shown in FIG. 11, the upper fiducial dot 58 viewed by camera 10 is displayed on display 1110 as a solid dot 1114. Surrounding the solid dot 1114 is a generally light, circular area 1116 representing the light directed upward by the illuminator. The remainder of the display contains an opaque perimeter image 1118 representing the board surface. The edge 1120 of circle 1116 represents the hole 41 in the board 40. When the board 40 is out of alignment with respect to the upper fiducial 58, the video cameras will receive input similar to display 1112 of the FIG. 11. In this display, the upper fiducial 58 is represented as dot 1124, which is shown off-center with respect to circle 1126. This indicates a misalignment situation requiring correction. It is noted that the fiducials and targets may have other shapes, such as square.

When the board is conveyed into the exposure chamber, the artworks are already aligned by their registration pin holes and camera inspection, and any necessary fine corrections. In the exposure chamber, computer control of the X, Y, and Theta tables enables alignment of the board to within 1/10,000" ($2.5 \times 10^{-4}$ cm). Alignment of the board with either artwork will align it with the other. In the disclosed embodiment, alignment is with respect to the upper artwork.

Holder 18 is lowered close to the board, but preferably in "off" contact position, i.e., no contact between the holder 18 and board. Preferably, the cameras 10, 12 are each mounted on a movable arm to enable the camera to be extended or retracted. Moving the cameras enables the entire board to be exposed and used, since a shadow will be cast over a portion of the board if the cameras are not moved rearward before the exposure flash. However, to prevent introducing error into the alignment system, the cameras preferably are movable on a precision slide within a very narrow range, such as an inch (2.5 cm). The preferred cameras 10, 12 comprise solid-state cameras which are relatively small in size, so that about an inch (2.5 cm) of longitudinal travel will completely retract the camera.

The two cameras 10, 12 then extend to determine the necessary alignment corrections to take place. Inspection of the target holes in the board 40 and the fiducials on the top artwork 17 takes place in X-, Y-, and Theta-directions by means of a "best-fit" data processing method (described below) which, in turn, moves the alignment stage 16, as necessary. When alignment is complete, the top artwork holder is lowered into soft contact with the board. The term "soft contact" refers to a condition in which the board is in physical contact with the upper and lower artwork holders, but before the application of vacuum to firmly press the three elements together. Inspection by the cameras occurs again, using the same fiducials and target holes. If alignment is proper, the cameras are retracted, and exposure takes place. If there is still misalignment, the upper artwork holder is raised to the off-contact position, so that the board can be moved using the X, Y, and Theta tables, as needed.

When the cameras are in the retracted position, and exposure is taking place, the cameras can be instructed to view the second set of fiducials (54 and 66 on axis 11a and 56 and 68 on another axis parallel to 11a), as shown in FIG. 6b to verify the position of upper and lower artworks for any possible deviations from initial setup.

If desired, exposure can take place with the board and artworks in "hard contact" by using vacuum force. If so, to account for a possible alignment shift, it is preferred to check alignment after application of the vacuum and before exposure. After exposure, the upper holder 18 is raised to its open position, and an outfeed carriage, identical to carriage 30, enters chamber 2. Its suction cups are energized, and the board is lifted off the align taper pins and removed to the outfeed station 6.

Another board can then be brought into chamber 2 by carriage 30.

C. Control System

Figure 9:
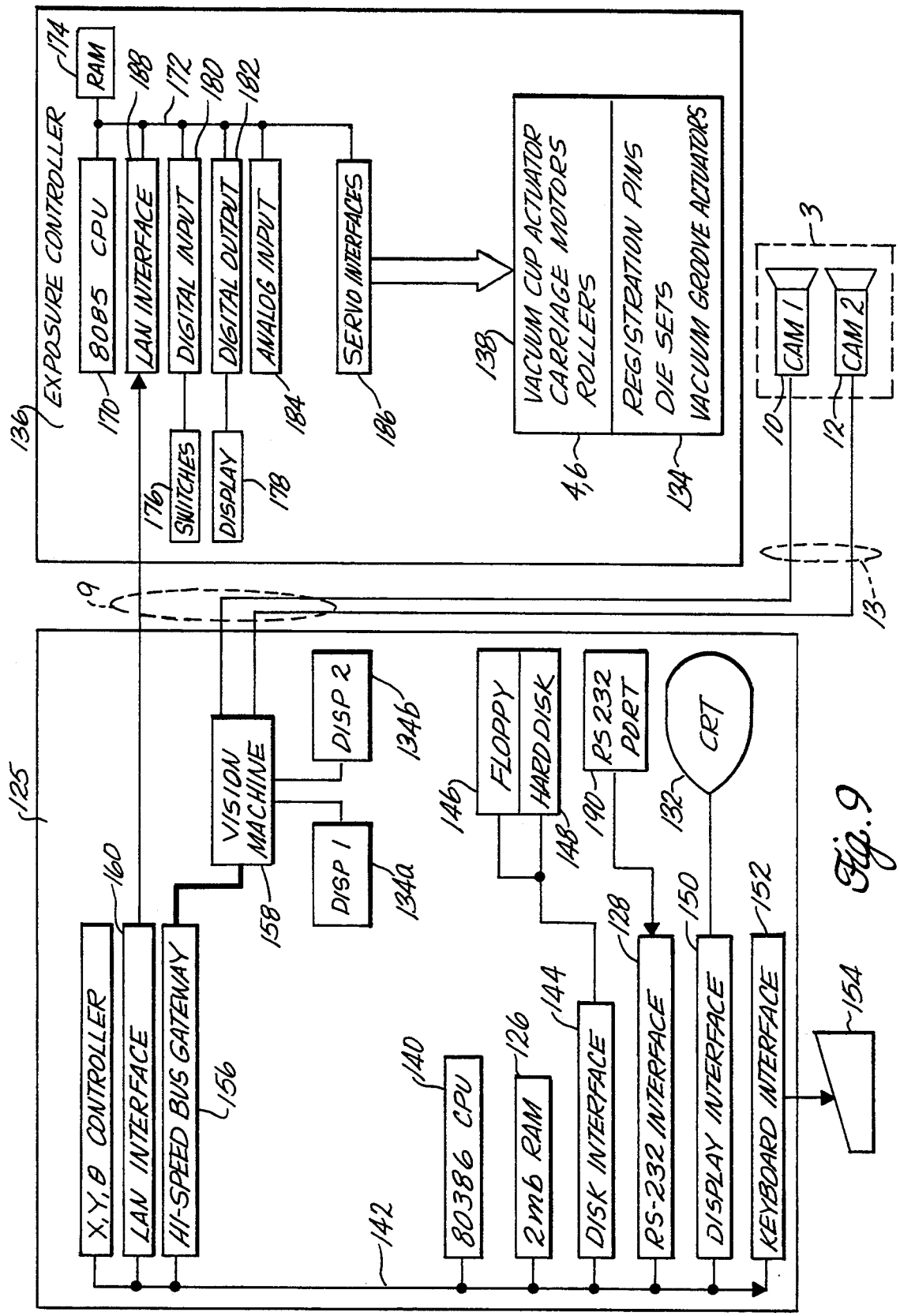
FIG. 9 is a schematic diagram of a control system for an exposure apparatus according to the invention.

The control system for the apparatus is shown in the schematic drawing in FIG. 9. Computer cabinet 8 includes a control unit 125 and a memory 126. The control unit 124 controls all operations of the machine. Preferably, at least some of the operations are also manually controllable.

Preferably, the control unit 125 comprises an 80386 central processing unit 140 which communicates with other control elements using a conventional microprocessor bus 142. The bus 142 preferably comprises a conventional data bus and an address bus. A conventional disk interface 144 provides a link between the CPU 140 and a mass storage system comprising a floppy disk drive and a hard disk drive. A suitable computer for control unit 125 is an IBM compatible, 80386 based computer, and a suitable mass storage system is a 1.44 megabyte floppy disk drive, a 40 megabyte hard disk, and a two megabyte RAM. The hard disk preferably contains the "best-fit" software, and the hard drive contains all other machine control. The RAM is used for calculations and the like. The control unit preferably includes a communications interface 128 coupled to an RS-232C communication port 190. The communication port enables the control unit to receive data, such as setup parameters for a particular board type or production run, from an external data source. A display interface 150 is coupled to a control display unit 132 (such as a CRT) for display of user instructions, menus, and alignment data. A keyboard interface 152 is provided to enable human communication with the CPU and software using a conventional keyboard 154.

Control unit 125 further comprises a high-speed bus gateway board 156 for bus-to-bus communication between CPU 140 and a vision machine processor 158. Video input from cameras 10, 12 is passed on a camera cable 13 (which can be integrated into cable 9) to video inputs of the vision machine processor 158. Camera target displays 134a, 134b, are connected to video outputs of the vision machine processor. Target displays 134a, 134b show fiducial alignment of the artworks and fiducial to target hole alignment of the upper artwork and target hole in the board, respectively, using displays, such as those shown in FIG. 11.

Preferably, the control unit 125 is located in an external cabinet 8. A separate exposure controller 136 is preferably mounted in machine cabinet 7 and communicates with the control unit 125 using a local area network (LAN) interface 160 in the control unit 125.

The exposure controller 136 comprises a CPU 170, such as an 8085 class processor coupled to a processor bus 172. Random access memory 174 is coupled to the processor bus 172, as are a plurality of input/output and control devices. ALAN interface 188 enables communication of CPU 170 with LAN interface 160 of the control unit 125. Preferably, a small control panel 7a is mounted in the exposure chamber to enable manual control of the exposure controller. The control panel preferably comprises a plurality of input switches 176 and a compact display 178, such as an LED or LCD display, which are respectively coupled to a digital input board 180 and a digital output board 182. An analog input board 184 enables the CPU 170 to receive input from analog devices, such as motors and actuators.

A plurality of servo interfaces 186 are provided, to enable control of the vacuum cups on carriage 30 and the outfeed carriage, motion control of each of these carriages, control of the infeed and outfeed rollers, and the stop bars, as represented by box 138, in each of the pre-alignment and collection stations 4, 6. The servo interfaces 138 also are coupled to the exposure shutter 124, a video camera position extension and retraction mechanism, the upper artwork holder position controlling mechanisms, the registration and align taper pin position control mechanisms, the alignment stage control mechanism, and the vacuum control mechanism for hard contact of the upper and lower artwork holders during their alignment and of the artwork holders and board if hard contact exposure is desired. This is represented by box 134. One of ordinary skill in the art of machine control will recognize that conventional means can be used to electrically couple the above mechanisms to servo interfaces in the exposure controller.

D. Setup and operation Summary

A brief summary of the preferable setup and operation processes of the exposure machine follows. For regard to setup, the following steps are preferred:

1. Enter the setup parameters, including the width, length, and thickness of the board, thickness of each artwork, X, Y, and Theta offset compensation tolerances for both the artworks and for the board, using keyboard 154 or the RS-232 port.

2. Put the machine in setup mode, with the die set is open, and pins 50, 52 are extended.

3. Insert the top and bottom artworks over the pre-alignment pins.

4. Close the die set (the artwork holders), preferably by lowering the upper artwork holder until it contacts the upper artwork. Apply vacuum to the grooves in the glass of each of the artwork holders and retract the pre-alignment pins.

5. The cameras 10, 12 inspect the fiducials on the upper and lower artworks for positional accuracy by checking alignment of fiducials 54, 56 with the lower artwork fiducials 66, 68 which are substantially directly below the upper fiducials, respectively.

6. Alignment will normally be within the desired tolerances due to the registration pins, and the camera can verify this. However, if misregistration is detected, or the pre-alignment holes 50, 52 in the upper artwork and lower artwork are only for rough alignment, the upper artwork holder 18 can be released and manipulated by micrometers to bring the artworks into precise alignment, then reclamped. Inspection by the cameras provides a visual image on camera monitors, and numeric display of displacement in the X, Y, and Theta positions, preferably to 1/10,000 of an inch ($2.5 \times 10^{-4}$ cm).

7. Once alignment is verified, the die set is moved to the open position and is ready for printing.

E. Printing Operation Summary

The sequence of printing operations is as follows.

1. Based upon the setup parameters entered above, the control system moves the pre-alignment stop bars 5 on the infeed under well-known servo control to the appropriate position and energizes the appropriate suction cups for transporting the desired panel size.

2. The panels are received on the infeed from a conveyor or loader mechanism, as is known in the art, and driven to the pre-alignment position against stop bars 5.

3. The carriage 30 with its suction cups enabled picks up the board and carries it into the exposure chamber 2 and places it on the align taper pins. The vertical positioning of these pins is set based upon the board thickness.

4. The die set closes to off-contact, and the cameras extend to determine the necessary alignment corrections to take place. The cameras look through the fiducials on the upper artwork to target holes on the board which are substantially directly below the fiducials.

5. The camera detects alignment, and the control system determines whether alignment is proper and sends commands to the alignment stage 16, if it is not. The alignment stage moves in the appropriate X, Y, and Theta directions to align the board with the upper artwork within the predetermined tolerances.

6. The upper artwork is lowered into soft contact, and the alignment is checked to determine any alignment shift caused by variations in glass flatness, sag, board thickness, and warpage that occur as a result of the contacting process for exposure. If misalignment is detected, the artwork holder is raised to off-contact, and the alignment stage performs the correction. The upper artwork holder is then lowered into contact so that exposure can occur.

7. If hard contact exposure is desired, a vacuum is applied, as is known in the art.

8. If the VERIFY option has been selected, another inspection of alignment accuracy can be performed.

9. If the pre-defined alignment tolerances are still met, the cameras retract, and exposure takes place.

10. While retracted for exposure, the cameras can perform a further inspection of the artwork, using targets 54 and 56 and 66 and 68, to ensure that the top-to-bottom alignment is maintained in the same manner as verification is performed in the above step.

11. After exposure is completed, the die set opens, and the panel is removed by the outfeed carriage.

F. Exposure Process and Optics

The exposure process will now be briefly described with reference to the schematic drawing of FIG. 8.

This process is generally conventional and is well known to those of ordinary skill in the art. Reference may be made to the Miyake patent for further information. The optical system includes a lamp housing 2a at the rear of exposure cabinet 2, having one or two high-pressure mercury or xenon short arc lamps 102 concentrically mounted vertically in an aspheric collector that preferably re-images greater than 80% of the arc radiance in a predetermined spectrum, e.g., 330 nm to 450 nm. The re-imaging is to a 3-inch diameter spot at an optical integrator 106. A UV dichroic cold mirror 104 passes the longer wavelengths to a heat sink 108 adjacent an exhaust vent 112. Suitable lamp wattage is 5000 or 8000 watts per lamp.

Optical integrator 106 includes multi-lens sticks of clear-fused silica. Each lens element 5 superimposes individual images which are passed or deflected through a 50-50 beam splitter 116 to upper and lower collimating mirrors 118, 120, respectively (in the case of a single lamp system). The superimposed images then pass from the mirrors 118, 120, respectively, through the upper and lower phototools 17, 19, respectively, to the upper and lower sides of board 40. The light then reacts with a photosensitive layer on each side of the board to imprint the phototool patterns thereon. The exposure controller 136 linked with the control unit 125 automatically controls a shutter 124 to provide a preset exposure time, or a constant joule exposure level.

G. Data Processing Operation

Figure 14:
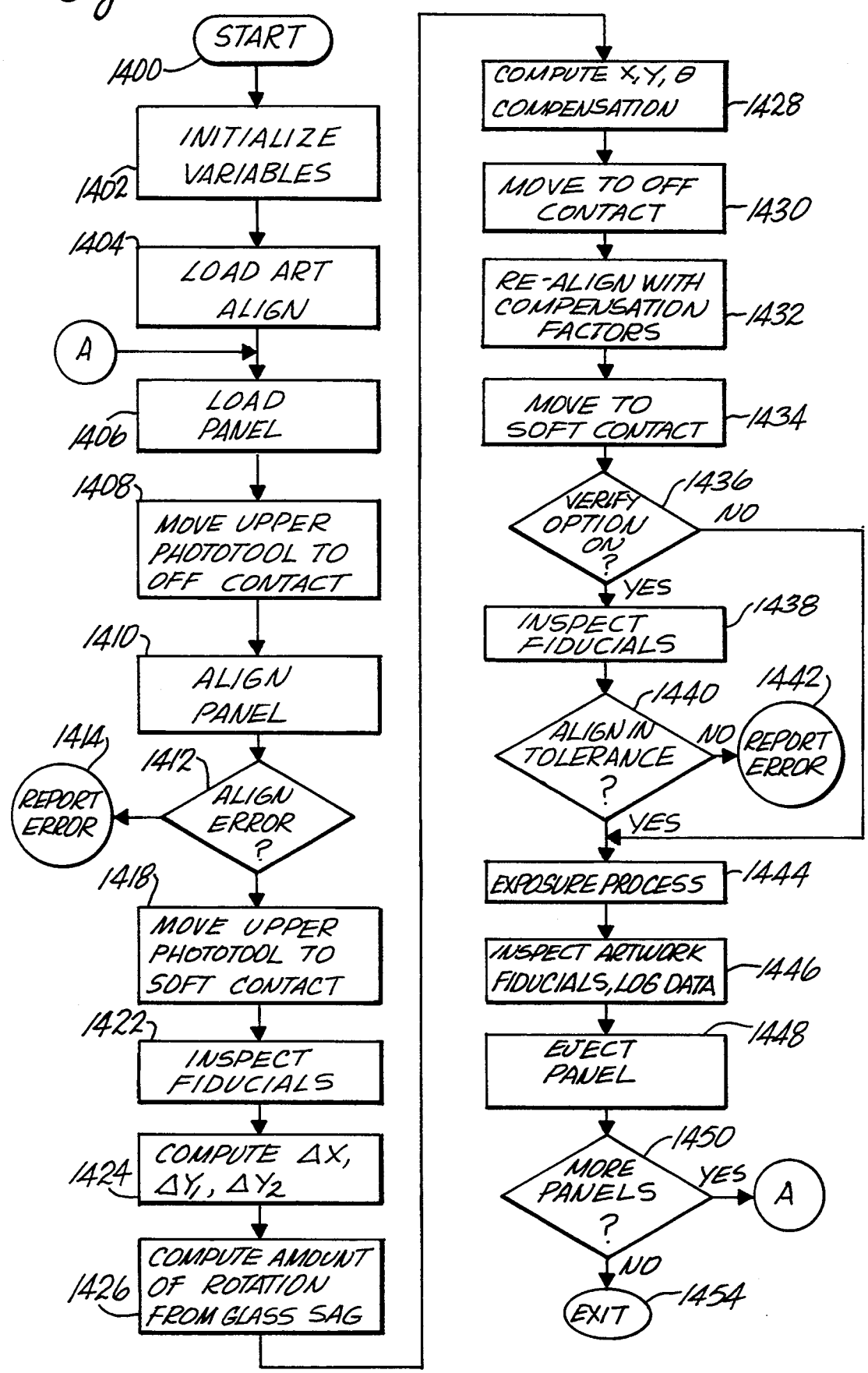
FIG. 14 is a flow diagram of a portion of a method of operating the apparatus.

The above operation steps can be implemented in a computer program written in the C programming language. An exemplary program is provided in the microfiche appendix hereto and a partial flow diagram of the program is shown in FIG. 14. The microfiche appendix contains a C language program and an assembly language program for the 8085 processor 170 of the exposure controller 136. The C program can be compiled with a C compiler to produce object code executable on the CPU 140 of the control unit 125. The code can run under the control of a conventional disk operating system, such as Microsoft MS-DOS, version 5.0, and can be loaded from the hard disk drive and executed in conventional manner.

After invocation, the control program preferably displays a main menu with four options as shown in Table 1:

TABLE 1

| Main Menu Options | | |
|---|---|---|
| Option | Keystroke | Function |
| Setup | S | Prepare machine for exposure |
| Cycle | C | Automatic exposure cycle |
| Manual | M | Manual operations |
| Exit | E | Exit program |

Figure 12:
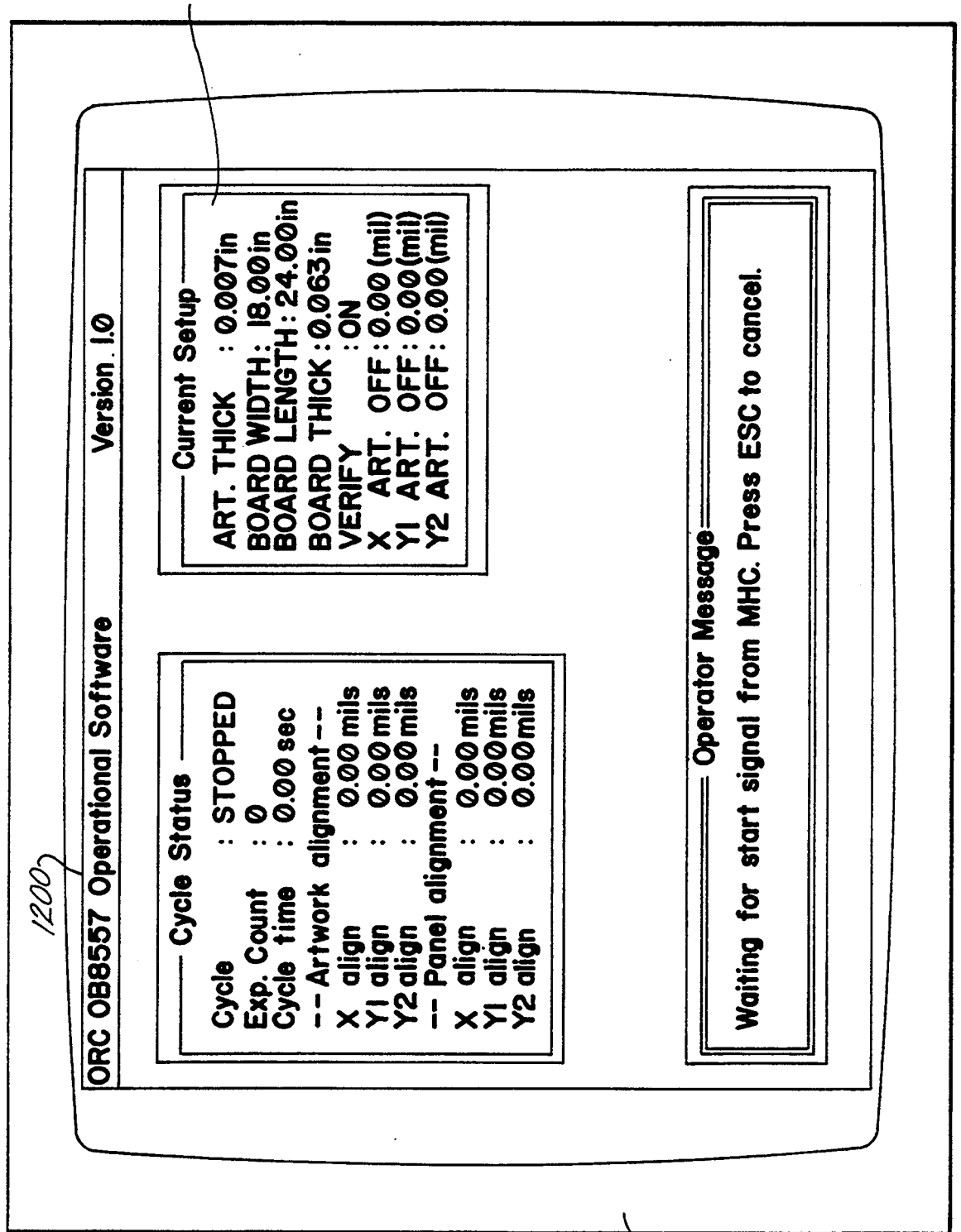
FIG. 12 is a diagram of a user data display.

One of skill in the art of computer programming will recognize that each option can be implemented using a separate procedure or function within the control program. In the preferred embodiment, upon invocation the program also displays additional information shown in FIG. 12, which is a representation of a display on CRT 132. The sign-on information can include a title bar 1200, showing the name of the program and its version number. Preferably, a CURRENT SETUP window 1202 is also displayed showing values in the computer memory for setup parameters, such as artwork thickness, board width, board length, board thickness, whether the VERIFY option is set on or off, and offset compensation values in the X and Y directions.

The computer program comprises an input routine for recognizing a single keystroke entered on the keyboard 154 by a user. The input routine tests whether the entered keystroke matches one of the letters in the KEYSTROKE column of Table 1. If so, the program recognizes selection of the corresponding option and branches to a corresponding function or procedure.

When the SETUP option is selected, the control program preferably displays a window showing the options listed in Table 2 below:

TABLE 2

| SETUP Options | | |
|---|---|---|
| Option | Keystroke | Function |
| Artwork thickness | t | Set artwork thickness |
| Board size | s | Set width |
| Board thickness | t | Set thickness |
| Verify | V | Set verify ON or OFF |
| Art. Offsets | O | Set artwork compensation |
| Align Artworks | 1 | Inspect artwork align |

The control program then waits for the user to select one of the options of Table 2 using a single keystroke. If any of the first five options are selected, the control program displays a prompt, such as ENTER ARTWORK THICKNESS and waits for a numeric entry by the user. The numeric entry is checked for validity, and if valid (i.e., within a proper range of values) the selected parameter is then set to the numeric entry. The new value of the parameter is then re-displayed in the appropriate location of SETUP WINDOW 1202.

If the ALIGN ARTWORKS option of Table 2 is selected, the control program performs the following functions. The upper artwork holder is moved to the soft contact position. The cameras 10, 12 are commanded to move to the retracted position of FIG. 6b so that the artwork alignment fiducials are viewed by the cameras. The output of the cameras is then switched to the target displays 1110, 1112 to enable visual verification of alignment. A user may then adjust manual micrometers of either the upper or lower artwork holders to precisely align the upper and lower artwork fiducials with one another.

If the CYCLE option of Table 2 is selected, the control program will cause the apparatus to automatically process a plurality of panels through the pre-align, alignment, exposure, and collection steps described above. FIG. 14 provides a high-level diagram of the flow of these steps. After the CYCLE option is initiated at block 1400, the control program initializes internal variables and data storage areas, e.g. by setting a plurality of glass sag compensation factors to zero. In step 1404 a user loads artwork to the upper and lower artwork holders and aligns it on the extended pins as described above.

In step 1406, the control program commands the carriage 30 of the infeed station 4 to load a panel for exposure into the exposure chamber. In step 1408 the upper artwork holder is moved to an off-contact position close to the panel. In step 1410, the cameras view the panel hole positions, and the panel is aligned by computer-controlled movement of the X, Y, Theta stages.

The alignment step 1410 further comprises a data processing method using the control unit 125 to compute rotation angles and translation vectors to align the board holes with the upper artwork fiducials. The method includes the ability to compensate for a difference in the center-to-center distance of the fiducials and board holes. The present invention incorporates a data processing method which computes a best fit for such fiducials and board holes.

In addition, the method includes steps to compensate for alignment error introduced by variations of the large glass plates used to hold artwork, the artworks, and the board itself. In the prior art, no compensation was provided for these variations. Such variations can cause significant error in alignment. In the prior art, alignment was accomplished in an off-contact position. When the glass phototools are brought into soft or hard contact in the prior art systems, glass sag and board warpage can cause shifting of center points.

The method follows three principal steps, each with a plurality of substeps, which will be explained with reference to FIGS. 11, 13, and 14.

Figure 10:
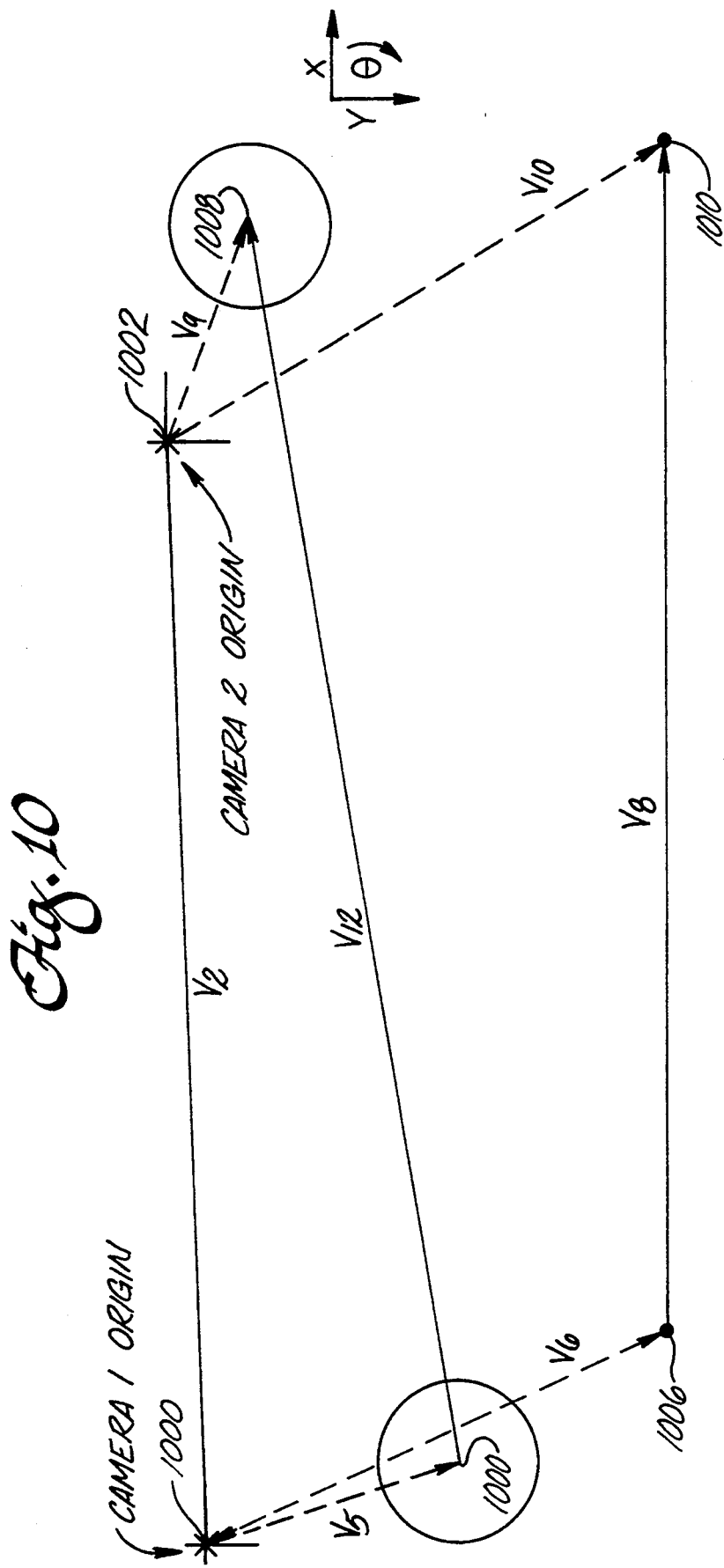
FIG. 10 is a diagram of the geometric relationship between board holes and artwork fiducials.

Given input data representing the lateral separation of the two cameras 10, 12, and the locations of the left and right board holes and left and right upper artwork fiducials, the first step is to calculate an angle Θ through which the board must be rotated. FIG. 10 is a diagram showing the geometrical arrangement of exemplary data points. The origin points 1000, 1002 of cameras 10, 12, respectively, are fixed and known. Center points 1004, 1006 of the left board hole and left upper artwork fiducial are also known by viewing the board and artwork in step 1410 using the cameras. Center points 1008, 1010 of the right board hole and right upper artwork fiducial are also known. One of skill in the art will recognize that these center points 1000 to 1010 can be derived using standard commercially-available machine vision software, which uses the centroids of light and dark circles viewed by the cameras to compute the screen pixel positions of the center points. Given the pixel positions, the vectors of Table 3 (shown in FIG. 10) are derived:

TABLE 3

| Vector | Known vectors<br>Identity |
| --- | --- |
| V2 | vector from camera 1 origin to camera 2 |
| V5 | location of left hole, relative to camera 1 origin |
| V6 | location of left fiducial, relative to camera 1 origin |
| V9 | location of right hole, relative to camera 2 origin |
| V10 | location of right fiducial, relative to camera 2 origin |

In FIG. 10, vector V8 represents the distance between the upper artwork fiducials and vector V12 represents the distance between the center points of the board holes. The inventors hereof have recognized that using the vectors of Table 3, vectors V8 and V12 of FIG. 10 can be derived as follows:

$$V8 = V2 + V10 - V6$$

$$V12 = V2 + V9 - V5$$

The rotation angle Θ is derived as follows:

$$\Theta = -\tan^{-1} \frac{V8y \cdot V12x - V8x \cdot V12y}{V8x \cdot V12x + V8y \cdot V12y}$$

Note that in the above equation, a negative sign precedes the inverse tangent symbol, because the desired angle Θ is the rotation from vector V12 to V8, not V8 to V12.

The second principal step of the data processing method is to determine the new center points of the holes after they have been rotated through the above angle Θ. FIG. 13 shows geometric locations of exemplary data points. Point 1300 represents the center of rotation of the X, Y, Theta stages. Points 1000, 1002, and vectors V5 and V9 correspond to like points in FIG. 10. In addition, vectors VPC1 and VPC2 are known, and respectively represent the distance from point 1300 to the camera origin points 1000, 1002. Points 1302, 1304 respectively represent the center points of the new hole locations after rotation through angle Θ. The inventors hereof have recognized that vectors V3 and V4 can be derived as:

$$V3 = VPC1 + V5$$

$$V4 = VPC2 + V9$$

The inventors have also recognized that vectors V13 and V14 of FIG. 13 can be derived as follows:

$$V3x^1 = V3x \cos \Theta - V3y \sin \Theta$$

-continued $$V3y^1 = V3x \sin \Theta + V3y \cos \Theta$$
$$V4x^1 = V4x \cos \Theta - V4y \sin \Theta$$
$$V4y^1 = V4x \sin \Theta + V4y \cos \Theta$$
$$V3' = (V3x, V3y) * \cos\Theta \sin\Theta - \sin\Theta \cos\Theta$$
$$V13 = V3 - V3'$$
$$V14 = V4 - V4'$$

Figure 13:
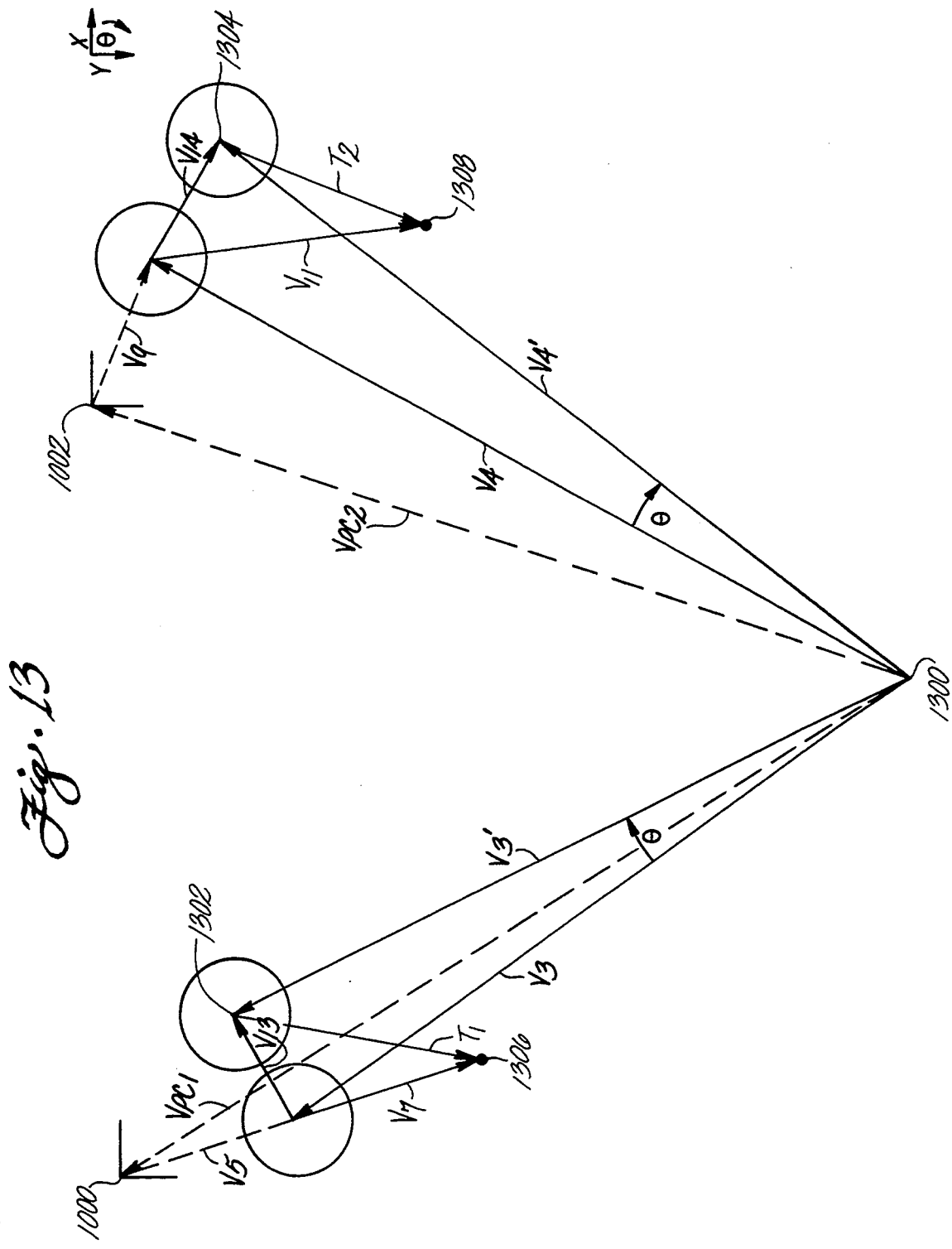
FIG. 13 is a diagram of the geometric relationship between board holes and artwork fiducials after translation and rotation.

The inventors have also recognized that the third principal step of the data processing method is to compute translation vectors T1, T2 to move the board hole center points into alignment with the fiducial points 1306, 1308 of FIG. 13. A first substep is to compute vectors V7, V11 which represent the distance from the hole center points to the fiducials:

$$V7 = V6 - V5$$

$$V11 = V10 - V9$$

Vectors V7, V11 are used to compute T1, T2 as follows:

$$T1 = V7 - V13$$

$$T2 = V11 - V14$$

Since the angle $\Theta$ effectively corrects T1 and T2 for rotational error, the Y components of T1 and T2 are expected to be about equal. Accordingly, the left hole vectors are used to derive the Y component of T1, T2:

$$Ty = V7y - V13y$$

The inventors are the first to recognize that a best fit value for the X component of T1, T2 can be derived by taking an average of the left and right side values:

$$Tx = (T1x + T2x)/2$$

Preferably, the above computations are implemented in computer instructions in the control program. Thus, the control program provides rapid means for computing best-fit rotation and translation vectors to align board holes and fiducials. Using the above computations, the control program can quickly determine how to rotate the board stage to arrive at the best possible alignment with both upper artwork fiducials.

If an error occurs during the above alignment procedure, as tested in step 1412, the control program will report the error in step 1414. The error report is a visually displayed error message and a data record written to a log file on the hard disk.

Otherwise, in step 1418, the control program commands the upper phototool to move down to soft contact with the board. In the prior art, an exposure would immediately occur. However, due to sag of the glass and other variations in the glass, artworks, and board, it is possible for an alignment error to be introduced at this point in the process. Accordingly, the present invention provides further steps 1422 to 1432 to determine whether error exists and compensate for it.

In step 1422, the cameras inspect the panel and artwork fiducial locations. The resulting data is saved by the control program as delta_x, delta_y1, and delta_y2. Y1 and y2 are separate y axis values from the left and right cameras 10, 12, respectively.

In step 1426, the program computes the amount of angular rotation $\Theta$ required to compensate for the delta factors. The rotation is yielded by delta_y1 − delta_y2. In step 1428 the program computes X, Y, and $\Theta$ compensation factors labeled sagXcomp, sagYcomp, and sagTcomp in learn_sag_offsets. Step 1428 includes sub-steps to translate the X, Y, and $\Theta$ values from pixels or inches to steps of the stepper motors in the X, Y, and $\Theta$ stages. The Appendix provides exemplary program code to implement these sub-steps.

In step 1430, the program commands the upper artwork holder to again move to off-contact to enable re-alignment of the board according to the compensation factors. In step 1432, compensation is performed by commanding the stages to move the board in directions which are opposite to the detected misalignment so that the panel will be intentionally misaligned during off-contact. Then, when hard contact is applied, glass sag and other variations will actually align the board, rather than introduce error.

In step 1434, the artwork holders are moved to soft contact. At this point, the board and art should be correctly aligned. If the VERIFY option is ON (step 1436), the system again inspects the panel and artwork fiducials and logs the results to a data file on hard disk 148 (step 1438). If alignment is out of tolerance (step 1440), the control program will report an error to CRT 132 and to the log file and eject the panel (step 1442).

In step 1444, the program commands the cameras to retract and the exposure controller to begin exposure. If desired, vacuum can be applied to place the artwork holders in hard contact with the board. The system again inspects the artwork fiducials at this time during the exposure (step 1446). Resulting data is saved in the log file for human analysis of machine tolerances. The board is then ejected to outfeed (step 1448). If more boards remain in the infeed area, as tested in step 1450, control is passed back to step 1406 for another iteration. Otherwise, the program exits at step 1454.

The CYCLE option is implemented in the C language program using the functions found in the CYCLE.C file, found at frame 13 of the appendix, and its associated header files. The third page of CYCLE.C contains a function "auto_mode" which implements the automatic cycle. As shown in FIG. 14, CYCLE.C and auto_mode contain program steps to determine the amount of mis-alignment of the artworks caused by sag of the glass artwork holders. The auto_mode function contains the following code:

```
if (syscfg.use_stage != FALSE) {
    sagXcomp = sagYcomp = sagTcomp = 0.0;
    t_entry(1);
    status = learn_sag_offsets()
    t_exit(1);
    t_entry(10);
    status = move_stage_offsets()
    t_exit(10);
}
```

The t_entry and t_exit functions call a timing routine used in debugging and performance measurement to measure the real time required to perform the function between the t_entry and t_exit functions. The function learn_sag_offsets is found in the printed appendix hereto. Thus, the CYCLE.C program and other C programs represent just one way to implement the process of FIG. 14.

If the MANUAL option is selected from the main menu of Table 1, the program displays a window on CRT 132 containing the option list of Table 4:

TABLE 4

MANUAL Options

Move die-set to Align Gap
Move die-set to contact position
Align panel
Align panel with offsets
Inspect alignment
Show pixel locations
Learn glass sag offsets
Set jog step
Jog X right (+)
Jog X left (−)
Jog Y up (−)
Jog Y down (+)
Jog Theta counterclockwise (+)
Jog Theta clockwise (−)

A user can select any desired option by moving arrow keys on the keyboard to the desired option and pressing ENTER. Each option causes the control program to command the exposure controller to execute a single step indicated by the option name, and then return control to the user. All the above options are well known in the prior art, except "Learn glass sag offsets" and "Align panel with offsets." If the "Learn" option is selected, the control program executes steps 1408 to 1428 of FIG. 14, discussed above. If the "Align panel with offsets" option is selected, the control program executes steps 1408 to 1434 of FIG. 14.

When the EXIT option is selected, the control program closes any active data files and returns CPU control to the operating system. Preferably, the Exit option also performs fail-safe shut-down tasks, such as checking to ensure that the die set is open and that the exposure shutter is closed.

It is understood that the present invention is not limited to the embodiment described above, and that various changes and modifications may be effected by on skilled in the art without departing from the scope or spirit of the invention.

APPENDIX
C Language Source Code to Determine Glass Sag
(SEE ALSO MICROFICHE APPENDIX)

```
extern long board_align_zpos;
extern double last_x_panel,last_x_artwork;
extern double last_y1_panel,last_y1_artwork;
extern double last_y2_panel,last_y2_artwork;
double sagXcomp,sagYcomp,sagTcomp;
int learn_sag_offsets(void)
{
int status;
double before_x,before_y1,before_y2;
double after_x,after_y1,after_y2;
double delta_x,delta_y1,delta_y2;
double rotation;
    /* raise Z stoppers to align position */
    t_entry(2);
    stg_z_move_wabs( board_align_zpos );
    t_exit(2);
    /* align panel */
    t_entry(3);
    status + align();
    t_exit(3);
    if ( status != 0){
      return( −1 );
    }
    /* inspect fiducials & save results */
    /*    status = panel_verify(); */
    /*    before_x = last_x_panel; */
    /*    before_y1 = last_y1_panel; */
    /*    before_y2 = last_y2_panel; */
    before_x = 0.0:
    before_y1 = 0.0:
```

APPENDIX
C Language Source Code to Determine Glass Sag
(SEE ALSO MICROFICHE APPENDIX)
-continued

```
    before_y2 = 0.0;
    /* lower Z stoppers to contact position */
    t_entry(7);
    stg_z_move_wabs( OL );
    t_exit(7);
    /* inspect fiducials */
    t_entry(8);
    status = panel_verify();
    t_exit(8);
    after_x = last_x_panel;
    after_y1 = last_y1_panel;
    after_y2 = last_y2_panel;
    /* calculate glass sag factors */
    delta_x = after_x − before_x;
    delta_y1 = after_y1 − before_y1;
    delta_y2 = after_y2 − before_y2;
    rotation = delta_y1 − delta_y2;
    /* if rotation is positive, this means the holes
    rotated CW so to compensate we want sagTcomp
    positive to rotate hole CCW */
    /* +9597 comes from :
       30 theta steps => a delta of 14.89 pixels in Y
       and 14.89 pixels * .00021 inches / Y pixel =>
    .003127 dy inches
       so conversion from how much delta Y to how many
    steps is:
          30 steps / .003127 dy inches => 9597
    steps / dy inch
    /*
    sagTcomp = rotation * 9597;
    /* now that we know we are going to rotate theta,
    this will affect the X alignment because theta rotation
    moves X. It will not affect the Y alignment because
    theta is symmetrical about Y, so the Y movements cancel
    each other out (in theory) */
    /* +.00004306 comes from :
       −30 theta steps => a movement of −5.86 pixels
    in X or 0.198 X pixels / theta step
       0.198 *8
    .0002175 inches / X pixel => .00004306 inches / theta
    steps
    */
    sagXcomp = − delta_x − sagTcomp * 0.00004306;
    sagYcomp = (delta_y1 + delta_y2) / 2.0;
    /* raise Z stoppers to align position */
    t_entry(9);
    stg_z_move_wabs( board_align_zpos );
    t_exit(9);
    return(0);
}
```

What is claimed is:

1. A method of alignment of a workpiece between upper and lower artworks held in upper and lower artwork holders of an exposure system for printing a pattern from the upper and lower artworks on upper and lower sides of the workpiece, the method executed within an exposure chamber, the method comprising the step of:

aligning an upper artwork with a lower artwork; and
moving a workpiece onto a lower artwork holder and gripping the workpiece by at least one align taper pin protruding upward from the lower artwork hold through the lower artwork and through the workpiece;
closing an upper artwork holder in relation tot he lower artwork holder to an off-contact position proximate the workpiece;
moving the workpiece in at least one of X, Y, and Theta directions by movement of the at least one align taper pin to align the workpiece with at least one of the upper and lower artworks;

closing the upper artwork holder in relation to the lower artwork holder to contact with the workpiece;

measuring misalignment of the workpiece with respect to the upper and lower artworks and computing at least one of X, Y, and Theta compensation factors; and moving the workpiece in at least one of X, Y and Theta directions using the X, Y, and Theta compensation factors to re-align the workpiece with at least one of the upper and lower artworks.

2. The method of claim 1, wherein the method is iterated for each of a plurality of workpieces, and wherein the first moving step comprises the sub-step of:

using the X, Y, and Theta compensation factors from a prior iteration of the method to determine X, Y, and Theta directions of movement for the first moving step.

3. The method of claim 1, wherein the step of measuring comprises the sub-steps of:

moving a video camera to view at least one upper fiducial on the upper artwork under illumination of a light source for passing through a target in the workpiece and the upper fiducial;

computing the location of the upper fiducial center, the target center, and the difference between the upper fiducial center and the target center;

computing X translation, Y translation, and Theta rotation values to align the upper fiducial center and target center; and adjusting the X translation and Y translation values by average X and Y best fit values if exact alignment of the upper fiducial center and target hole center is impossible.

4. The method of claim 1, wherein the first moving step further comprises the steps of:

measuring misalignment of the workpiece with respect to the upper and lower artworks and computing first X, Y, and Theta translation values representing the amount of misalignment of the workpiece;

and wherein the step of measuring comprises the sub-steps of:

moving a video camera to view at least one upper fiducial on the upper artwork under illumination of a light source passing through a lower fiducial in the lower artwork and a target in the workpiece;

computing the location of the upper fiducial center, the target center, and the difference between the upper fiducial center and the target center;

computing second X translation, Y translation, and Theta rotation values to align the upper fiducial center and target hole center, derived by the difference between the first X, Y, and Theta values and the upper fiducial center and the target hole center; and adjusting the second X and Y values by average X and Y best fit values if exact alignment of the upper fiducial center and target hole center is impossible.

5. The method of claim 1, implemented in a stored computer program for a data processor coupled to at least one video camera viewing at least one upper fiducial on the upper artwork, at least one lower fiducial on the lower artwork, and at least one target in the workpiece, the video camera providing a digitized bull's-eye image output to the data processor, the image comprising an opaque circle representing the upper fiducial and a non-opaque area representing the target, wherein the step of measuring misalignment comprises the steps of:

storing an image output in a memory coupled to a data processor;

scanning the memory to locate X and Y centers of the opaque circle and the non-opaque area; and converting pixel values representing the X and Y centers into real measurements.

6. The method of claim 1, further comprising the step of displaying the X, Y, and Theta compensation factors in real time.

7. The method of claim 1, further comprising the step of displaying at least one parameter chosen from a set of parameter relating to the apparatus, the set consisting essentially of: artwork thickness; workpiece width; workpiece length; workpiece thickness; and the X, Y, and Theta compensation factors.

8. The method of claim 1, further comprising the step of displaying at least one parameter chosen from a second set of parameters relating to status of an iterative cycle of workpiece exposures, the second set consisting essentially of: exposure count; cycle time; artwork X alignment; artwork Y alignment; panel X alignment; and panel Y alignment.

9. A method of aligning a blank printed circuit board between upper and lower structure held in upper and lower artwork holders of exposure system for printing a pattern from the upper and lower artworks on upper and lower sides of the board, the system comprising at least one data processor coupled to at least one video camera viewing at least one upper fiducial on the upper artwork, at least one lower fiducial on the lower artwork, and at least one target in the board, the video camera providing a digitized bull's-eye image output to the data processor, the image comprising an opaque circle representing the upper fiducial and a non-opaque area representing the target, the method comprising the steps of:

aligning an upper artwork with a lower artwork;

moving a board onto the lower artwork and gripping the board by at least one align taper pin protruding upward from a lower artwork holder through the lower artwork;

closing an upper artwork holder in relation to the lower holder to an off-contact position proximate the board, moving the align taper pin to move the board in at least on of X, Y, and Theta directions to align the board with at least one of the upper and lower artworks, thereby aligning the board with the other of the upper and lower artworks;

closing the upper artwork holder in relation to the lower artwork holder to contact the board;

measuring misalignment of the board with respect to the upper and lower artworks and computing X, Y, and Theta compensation factors; and moving the align taper pin to move the board in at least one of X, Y, and Theta directions using the X, Y and Theta compensation factors to realign the board with at least one of the upper and lower artworks.

10. The method of claim 9, wherein the method is iterated for each of a plurality of boards, and wherein the first moving step comprises the sub-step of:

using the X, Y, and Theta compensation factors from a prior iteration of the method to determine X, Y, and Theta directions of movement for the first moving step.

11. The method of claim 9, wherein the step of measuring comprises the sub-steps of:
moving a video camera to view at least one upper fiducial on the upper artwork under illumination of a light source for passing light through a target in the board and the upper fiducial;
computing the location of the upper fiducial center, the target hole center, and the difference between the upper fiducial center and the target center;
computing X translation, Y translation, and Theta rotation values to align the upper fiducial center and target center; and
adjusting the X translation and Y translation values by average X and Y best fit values if exact alignment of the upper fiducial center and target center is impossible.

12. The method of claim 9, wherein the first moving step further comprises the steps of:
measuring misalignment of the board with respect to the upper and lower artworks and computing first X, Y, and Theta translation values representing the amount of misalignment of the board;
and wherein the step of measuring comprises the sub-steps of:
moving a video camera to view at least one upper fiducial on the upper artwork under illumination of a light source for passing light through a target in the board and the upper fiducial;
computing the location of the upper fiducial center, the target center, and the difference between the upper fiducial center and the target center;
computing second X translation, Y translation, and Theta rotation values to align the upper fiducial center and target center, derived by the difference between the first X, Y, and Theta values and the upper fiducial center and the target center; and
adjusting the second X and Y values by average X and Y best fit values if exact alignment of the upper fiducial center and target center is impossible.

13. The method of claim 9, wherein the step of measuring misalignment comprises the steps of:
storing the image output in a memory coupled to the data processor;
scanning the memory to locate X and Y centers of the opaque circle and the non-opaque area; and
converting pixel values representing the X and Y centers into real measurements.

14. The method of claim 9, further comprising the step of displaying the X, Y, and Theta compensation factors in real time.

15. The method of claim 9, further comprising the step of displaying at least one parameter chosen from a set of parameters relating to the apparatus, the set consisting essentially of artwork thickness; board width; board length; board thickness; and the X, Y, and Theta compensation factors.

16. The method of claim 9, further comprising the step of displaying at least one parameter chosen from a second set of parameters relating to status of an iterative cycle of board exposures, the second set comprising: exposure count; cycle time; artwork X alignment; artwork Y alignment; panel X alignment; and panel Y alignment.

17. An alignment and exposure apparatus for printing a pattern from upper and lower artworks on upper and lower sides of a board held between the upper and lower artworks in upper and lower artwork holders, the apparatus comprising:
at least one general purpose data processor coupled to a program memory and a mass storage device;
at least one video camera having an image output coupled to the data processor;
an exposure controller coupled to the data processor and the artwork holders for selectively moving at least one of the artwork holders to open, soft contact, and hard contact positions with respect to the board; and
a stored computer program in the mass storage device and loadable to the program memory comprising computer instructions for the data processor operative for:
with upper and lower artwork holders in an off-contact position, commanding the exposure controller to move at least one align taper pin extending through the board in at least one of X, Y, and Theta directions to align the board with at least one of the upper and lower artworks;
closing the upper and lower artwork holders to at least soft contact with the board;
measuring misalignment of the board with respect to an upper and a lower artwork and computer X, Y, and Theta compensation factors, using the image output;
commanding the exposure controller to open and upper and lower artwork holders relative to each other so that the board is movable; and
moving the at least one align taper pin to urge the board in at least one of X, Y, and Theta directions using the X, Y, and Theta compensation factors to re-align the board with at least one of the upper and lower artworks.

18. The apparatus of claim 17, the stored computer program containing instructions which are iterated for each of a plurality of boards, and wherein the first instruction for moving the board further comprises using the X, Y, and Theta compensation factors from a prior iteration of the apparatus to determine X, Y, and Theta directions of movement for the first moving step.

19. The apparatus of claim 17, wherein the stored program further includes instructions operative for:
aligning the upper artwork with the lower artwork; and
moving the board onto the lower artwork holder and gripping the board by at least one align taper pin protruding upward from the lower artwork holder through the lower artwork.

20. The apparatus of claim 17, wherein the stored program further comprises instructions operative for:
moving a video camera to view at least one upper fiducial on the upper artwork under illumination of a light source for passing light through the upper fiducial and a target in the board;
computing the location of the upper fiducial center, the target center, and the difference between the upper fiducial center and the target center;
computing X translation, Y translation, and Theta rotation values to align the upper fiducial center and target center;
adjusting the X translation and Y translation values by average X and Y best fit values if exact alignment of the upper fiducial center and target center is impossible.

21. The apparatus of claim 17 wherein the first moving instruction of the program further comprises instructions operative for:

measuring misalignment of the board with respect to the upper and lower artworks and computing first X, Y, and Theta translation values representing the amount of misalignment of the board.

22. The apparatus of claim 17, wherein the instruction for measuring further comprises instructions operative for:

moving a video camera to view at least one upper fiducial on the upper artwork under illumination of a light source for passing light through a target in the board and the upper fiducial;

computing the location of the upper fiducial center, the target center, and the difference between the upper fiducial center and the target center;

computing second X translation, Y translation, and Theta rotation values to align the upper fiducial center and target center, derived by the difference between the first X, Y, and Theta values and the upper fiducial center and the target center; and adjusting the second X and Y values by average X and Y best fit values if exact alignment of the upper fiducial center and target center is impossible.

23. The apparatus of claim 17, wherein the instruction for measuring misalignment comprises program instructions operative for:

storing the image output in a memory coupled to the data processor;

scanning the memory to locate X and Y centers of the opaque circle and the non-opaque area; and converting pixel values representing the X and Y centers into real measurements.

24. The apparatus of claim 17, further comprising means for displaying the X, Y, and Theta compensation factors in real time.

25. The apparatus of claim 24, further comprising means for displaying at least one parameter chosen from a set of parameters relating to the apparatus, the set consisting essentially of: artwork thickness; board width; board length; board thickness; and the X, Y, and Theta compensation factors.

26. The apparatus of claim 25, further comprising means for displaying at least one parameter chosen from a second set of parameters relating to status of an iterative cycle of board exposures, the second set comprising: exposure count; cycle time; artwork X alignment; artwork Y alignment; panel X alignment; and panel Y alignment.

* * * * *

UNITED STATES PATENT AND TRADEMARK OFFICE
CERTIFICATE OF CORRECTION

PATENT NO. : 5,337,151

DATED : August 9, 1994

INVENTOR(S) : Gregory R. Baxter; Jeffrey Tesone; Glenn Rivard

It is certified that error appears in the above-indentified patent and that said Letters Patent is hereby corrected as shown below:

Column 1, line 19, change "therefor" to -- therefore --.

Column 2, line 48, change "X Y" to -- X, Y, --.

Column 5, line 19, change "0,015"" to -- 0.015" --.
Column 5, line 21, change "0,750"" to -- 0.750" --.
Column 5, line 22, change "0,060"" to -- 0.060" --.

Column 9, line 57, change "ALAN" to -- A LAN --.

Column 10, line 23, change "For" to -- In --.
Column 10, line 30, after "die set" delete "is".

Column 11, line 58, after "element" delete "5".

Column 14, line 37, change "angle 8" to -- angle θ --.

Column 17, line 37, after "effected by" change "on" to -- one --.

Column 18, line 55, change "step" to -- steps --.
Column 18, line 62, change "tot he" to -- to the --.

Column 20, line 14, change "parameter" to -- parameters --.
Column 20, line 26, change "structure" to -- artworks --.
Column 20, line 48, after "least" change "on" to -- one --.

UNITED STATES PATENT AND TRADEMARK OFFICE
CERTIFICATE OF CORRECTION

PATENT NO. : 5,337,151

DATED : August 9, 1994

INVENTOR(S) : Gregory R. Baxter; Jeffrey Tesone; Glenn Rivard

It is certified that error appears in the above-indentified patent and that said Letters Patent is hereby corrected as shown below:

Column 21, 60, change "comprising" to
-- consisting essentially of --.

Column 24, lines 22,23, change "comprising" to
-- consisting essentially of --.

Signed and Sealed this

Seventh Day of November, 1995

Attest:

BRUCE LEHMAN

Attesting Officer    Commissioner of Patents and Trademarks